United States Patent [19]
Kata et al.

[11] Patent Number: 5,683,942
[45] Date of Patent: Nov. 4, 1997

[54] METHOD FOR MANUFACTURING BUMP LEADED FILM CARRIER TYPE SEMICONDUCTOR DEVICE

[75] Inventors: Keiichiro Kata; Shuichi Matsuda; Eiji Hagimoto, all of Tokyo, Japan

[73] Assignee: NEC Corporation, Tokyo, Japan

[21] Appl. No.: 450,728

[22] Filed: May 25, 1995

[30] Foreign Application Priority Data

May 25, 1994 [JP] Japan ................... 6-110857

[51] Int. Cl.⁶ ........................... H01L 21/60
[52] U.S. Cl. ................. 437/209; 437/211; 437/214; 437/217
[58] Field of Search ................ 437/209, 211, 437/212, 214, 217, 219, 220

[56] References Cited

U.S. PATENT DOCUMENTS

| | | | |
|---|---|---|---|
| 5,001,545 | 3/1991 | Kialfus et al. | 437/220 |
| 5,057,456 | 10/1991 | Dehaine | 437/220 |
| 5,138,145 | 8/1992 | Nakamura et al. | 437/212 |
| 5,164,336 | 11/1992 | Ohno et al. | 437/220 |
| 5,275,970 | 1/1994 | Itoh et al. | 437/204 |
| 5,300,458 | 4/1994 | Kuhnert et al. | 437/212 |
| 5,350,947 | 9/1994 | Takekawa et al. | |
| 5,367,435 | 11/1994 | Andros et al. | |
| 5,367,763 | 11/1994 | Lam | 437/220 |
| 5,385,869 | 1/1995 | Liu et al. | 437/217 |
| 5,518,957 | 5/1996 | Kim | 437/212 |

FOREIGN PATENT DOCUMENTS

| | | |
|---|---|---|
| 0 459 493 | 12/1991 | European Pat. Off. |
| 49-52973 | 5/1974 | Japan |
| 53-56969 | 5/1978 | Japan |
| 62-293730 | 12/1987 | Japan |
| 2-229443 | 9/1990 | Japan |
| 2-229445 | 9/1990 | Japan |
| 3-48435 | 3/1991 | Japan |
| 4-154136 | 5/1992 | Japan |
| 4-164344 | 6/1992 | Japan |
| 5-47847 | 2/1993 | Japan |
| 5-082586 | 4/1993 | Japan |
| 5-82586 | 4/1993 | Japan |
| 5-235091 | 9/1993 | Japan |
| 6-140462 | 5/1994 | Japan |

*Primary Examiner*—Kevin Picardat
*Attorney, Agent, or Firm*—Young & Thompson

[57] ABSTRACT

An insulating film has conductive layers on a first surface and conductive protrusions on a second surface. The conductive layers are connected to the conductive protrusions via through holes provided in the insulating film. A semiconductor chip having pads is adhered by an adhesive layer to the insulating film. Then, the conductive layers are locally pressured, so that the conductive layers are electrically connected to respective ones of the pads.

52 Claims, 22 Drawing Sheets

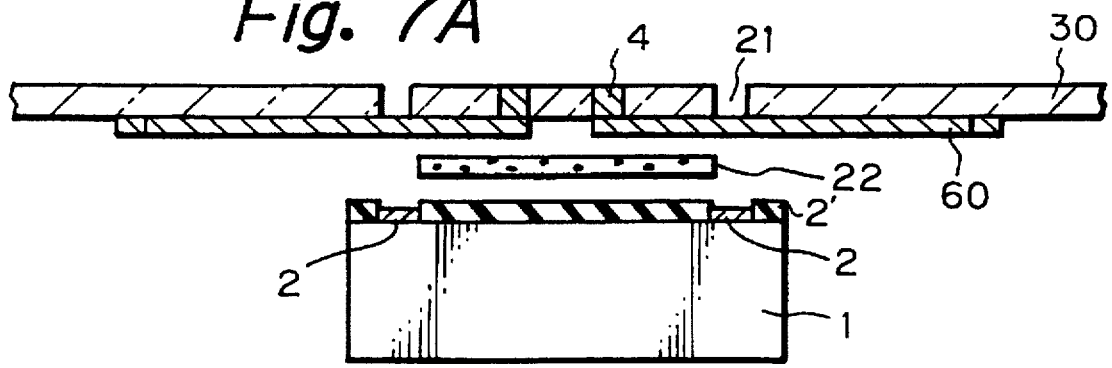
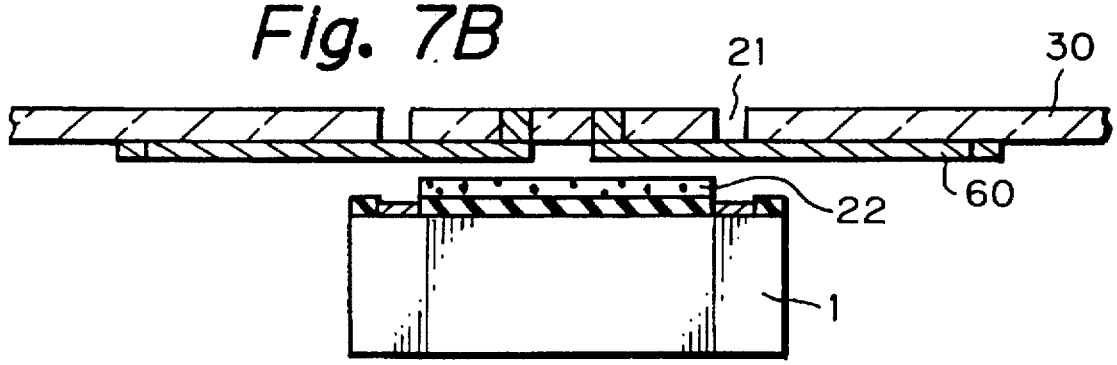
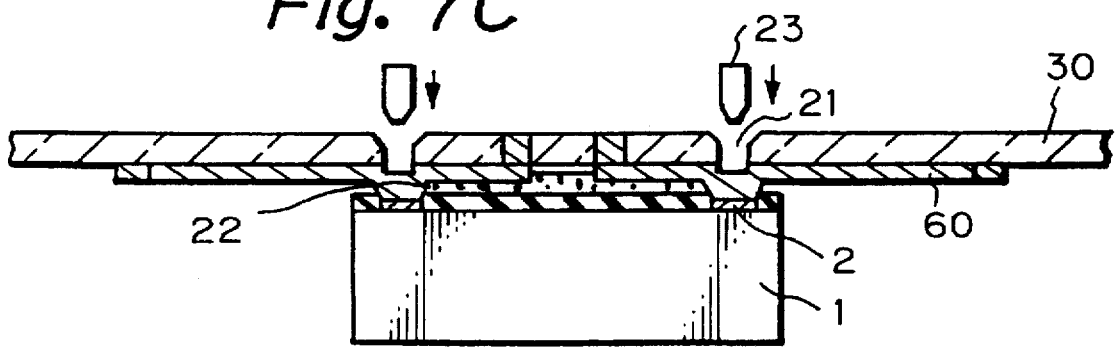
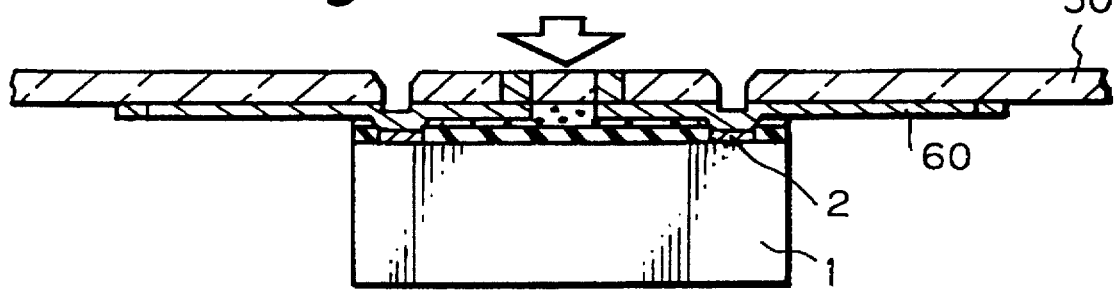

METHOD FOR MANUFACTURING BUMP LEADED FILM CARRIER TYPE SEMICONDUCTOR DEVICE

BACKGROUND OF THE INVENTION

1. Field of the Invention

The present invention relates to a method for manufacturing a bump leaded film carrier type semiconductor device.

2. Description of the Related Art

New semiconductor packages have been developed to correspond to requirements of electronic apparatuses which are of a smaller size, of a smaller weight, of a higher speed and of a higher function. In order to satisfy such requirements, it is necessary to reduce the pitch of inner leads, i.e., portions of leads connected to a semiconductor chip, simultaneously with the adoption of an area array bonding system capable of enlarging the pitch of outer leads.

One typical inner lead bonding (ILB) system is a wire bonding system which, however, cannot correspond to the increased number of multi-pins and the narrowed pitch of pads of the semiconductor chip. Recently, a tape automated bonding (TAB) system has been broadly used to reduce the size of semiconductor devices. In the TAB system, inner leads made of metal foil by etching on an insulating film are bonded to conductive protrusions (bumps) formed on pads of a chip.

One typical area array bonding system is a flip-chip bonding system. In the flip-chip bonding system, solder bumps are formed on an active element surface of a chip, and then, the chip is reversed and is bonded directly to a substrate, thus corresponding to multi-pins and small-pitched pins. In this case, the length of bonded connections is so short that there is an advantage in high speed and low noise.

In the above-described bonding systems, a process for forming barrier metal and bumps on electrode pads of a bare chip is generally required. For example, when solder is applied as bump material for aluminum electrodes, Cr or Ti as an adhesive layer and Cu, Ni, Rh or Pd as a diffusion avoiding layer have to be formed on electrode faces by a sputtering method or an evaporation method. Also, a step for forming bumps made of solder or Au by ball bumps or by plating is required. Further, in the TAB system, a transfer bump system or mesa bump system for bonding bumps formed on inner leads has been suggested.

In order to make use of both of the advantages of the TAB system and the flip-chip bonding system, first prior art bump leaded film carrier type semiconductor devices have been suggested where bumps are formed on a chip facing side of an insulating film (see: JP-A-SHO53-56969, JP-A-HEI5-47847, JP-A-HEI2-229445). This will be explained later in detail.

In the first prior art bump leaded film carrier type semiconductor device, however, outer leads, i.e., portions of leads connected to a substrate extend to the outside, and as a result, there is a disadvantage in size.

Second prior art bump leaded film carrier type semiconductor devices have also been suggested where bumps are formed on a substrate facing side of an insulating film (see: JP-A-HEI4-154136, JP-A-HEI5-82586). In the second prior art bump leaded film carrier semiconductor devices, since outer leads extend toward the inside, the second prior art bump leaded film carrier type semiconductor devices can be reduced in size as compared with the first prior art bump leaded film carrier type semiconductor devices. This will be explained later in detail.

In the second prior art bump leaded film carrier type semiconductor devices, however, the deformation of the insulating film is very large, or the devices are still large in size.

SUMMARY OF THE INVENTION

It is an object of the present invention to provide a method for manufacturing a bump leaded film carrier type semiconductor device which can be firm as well as small in size.

According to the present invention, an insulating film has conductive layers on a first surface and conductive protrusions on a second surface. The conductive layers are connected to the conductive protrusions via through holes provided in the insulating film. A semiconductor chip having pads is adhered by an adhesive layer to the insulating film. Then, the conductive layers are locally pressured, so that the conductive layers are electrically connected to respective ones of the pads. Thus, the device can be made firm by the combination of the semiconductor chip and the insulating film using the adhesive layer. Simultaneously, since the adhesive layer can be thin, the device can be small in size.

BRIEF DESCRIPTION OF THE DRAWINGS

The present invention will be more clearly understood from the description as set forth below, as compared with the prior art, with reference to the accompanying drawings, wherein:

FIGS. 7A through 7H are cross-sectional views for explaining the manufacturing steps of the device of FIG. 5A;

DESCRIPTION OF THE PREFERRED EMBODIMENTS

Before the description of the preferred embodiments, prior art bump leaded film carrier type semiconductor devices will be explained with reference to FIGS. 1, 2A, 2B, 3 and 4.

Figure 1:
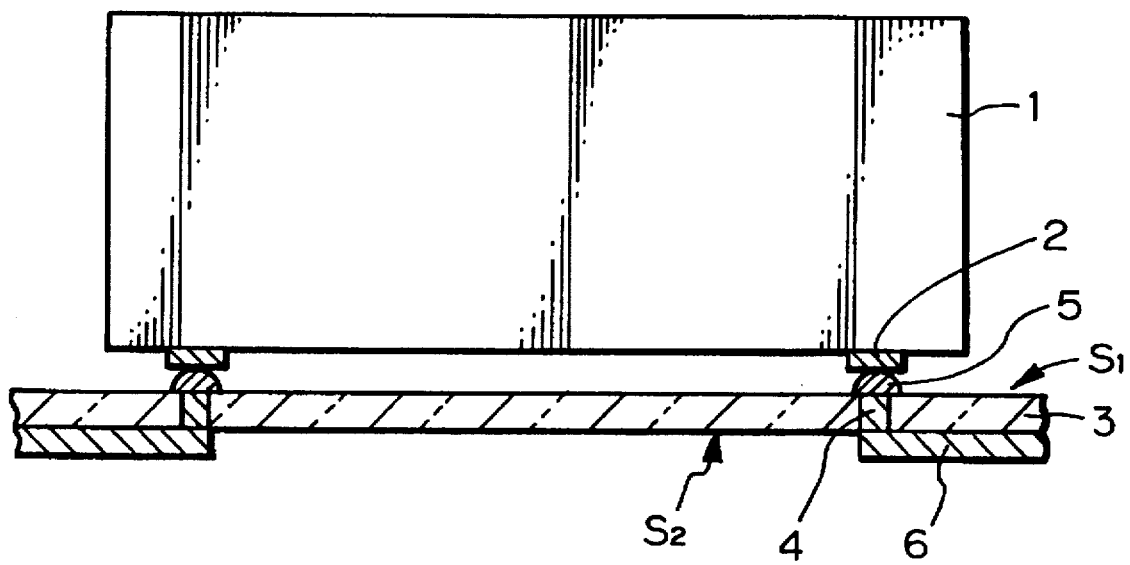
FIG. 1 is a cross-sectional view illustrating a first prior art bump leaded film carrier type semiconductor device.

In FIG. 1, which illustrates a first prior art bump leaded film carrier type semiconductor device (see: JP-A-SHO53-56969, JP-A-HEI5-47847), reference numeral 1 designates a bare chip having pads 2. Also, reference numeral 3 designates an insulating film made of polyimide or the like. Throughholes are perforated by a photolithography and etching process or a pressing process in the insulating film 3, and conductive members 4 are fitted into the through holes. Also, conductive protrusions, i.e., bumps 5 coupled to the conductive members 4 are provided on a first surface $S_1$ of the insulating film 3. On the other hand, conductive layers 6 coupled to the conductive members 4 are provided on a second surface $S_2$ of the insulating film 3.

In the device of FIG. 1, however, outer leads (not shown) of the conductive layers 6 are located outside of the chip 1, which increases the device of FIG. 1 in size. Also, since the support of the chip 1 to the insulating film 3 is carried out by only the bonding of the pads 2 to the bumps 5, the mechanical strength of the device is deteriorated.

Figure 2A:
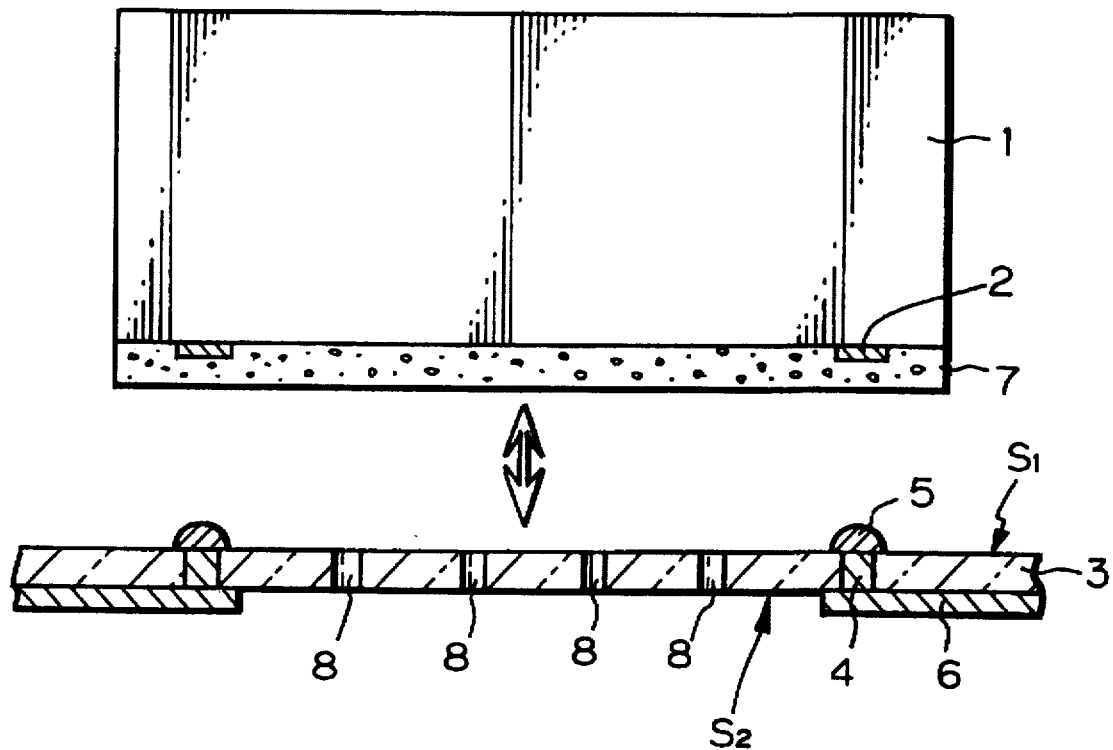
FIGS. 2A and 2B are cross-sectional views illustrating a modification of the device of FIG. 1.
Figure 2B:
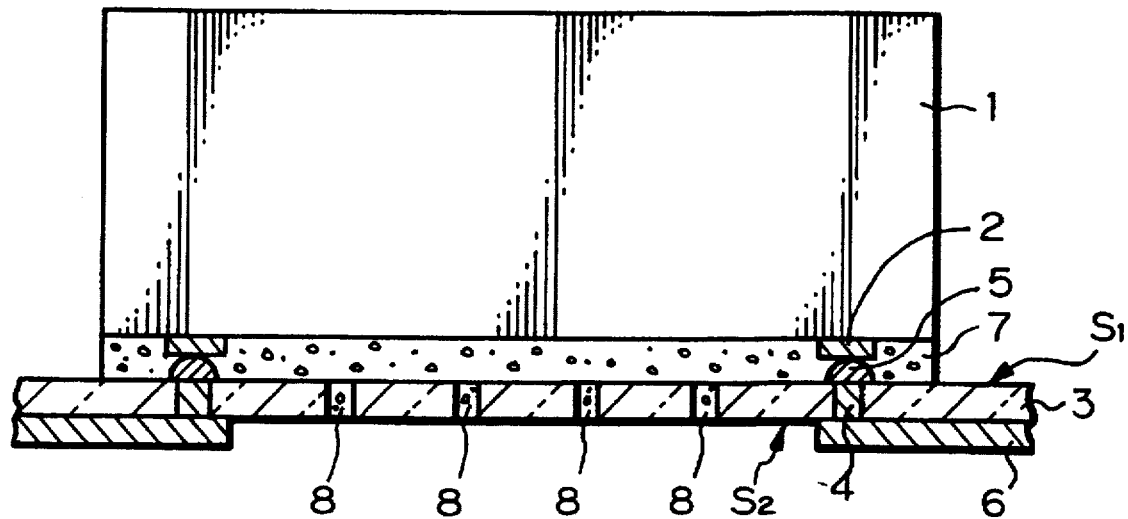

In FIGS. 2A and 2B, which illustrate a modification of the device of FIG. 1 (see: JP-A-HEI2-229445), means for improving contact characteristics of the chip 1 to the insulating film 3 is added to the elements of the device of FIG. 1. That is, a thermal adhesive resin layer 7 is formed on a pad forming face of the chip 1, while openings 8 are provided in the insulating film 3. When the chip 1 is bonded to the insulating film 3, the contact characteristics of the chip 1 to the insulating film 3 is improved, and simultaneously, the chip 1 can be electrically protected.

In the device of FIGS. 2A and 2B, however, since the outer leads (not shown) are still located outside of the chip 1, the device of FIGS. 2A and 2B is disadvantageous in size.

Figure 3:
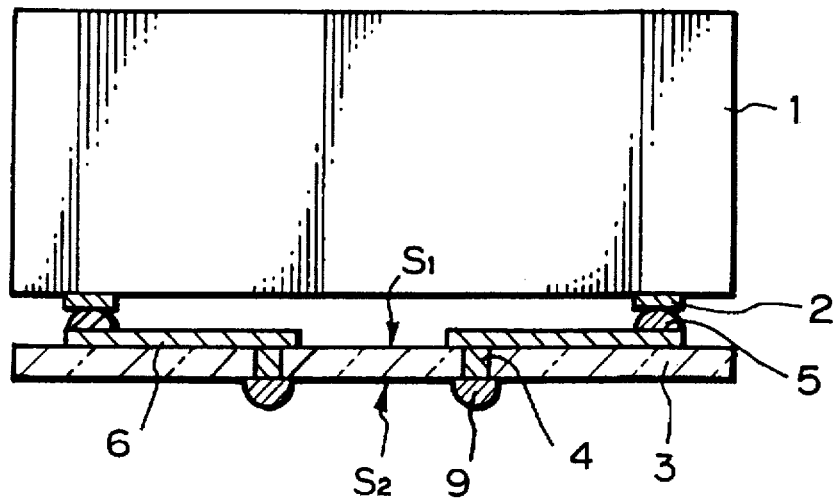
FIG. 3 is a cross-sectional view illustrating a second prior art bump leaded film carrier type semiconductor device.

In FIG. 3, which illustrates a second prior art bump leaded film carrier type semiconductor device (see: JP-A-HEI4-154136), bumps are provided instead of the outer leads of FIGS. 1, 2A and 2B. That is, the conductive layers 6 are provided on the first surface $S_1$ of the insulating film 3, and bumps 9 coupled to the conductive members 4 are provided on the second surface $S_2$ of the insulating film 3. As a result, an area array bonding system can be adopted. Also, the device of FIG. 3 is advantageous in size.

In the device of FIG. 3, however, since the support of the chip 1 to the insulating film 3 is still carried out by only the bonding of the pads 2 to the bumps 5, the mechanical strength of the device is deteriorated.

Figure 4:
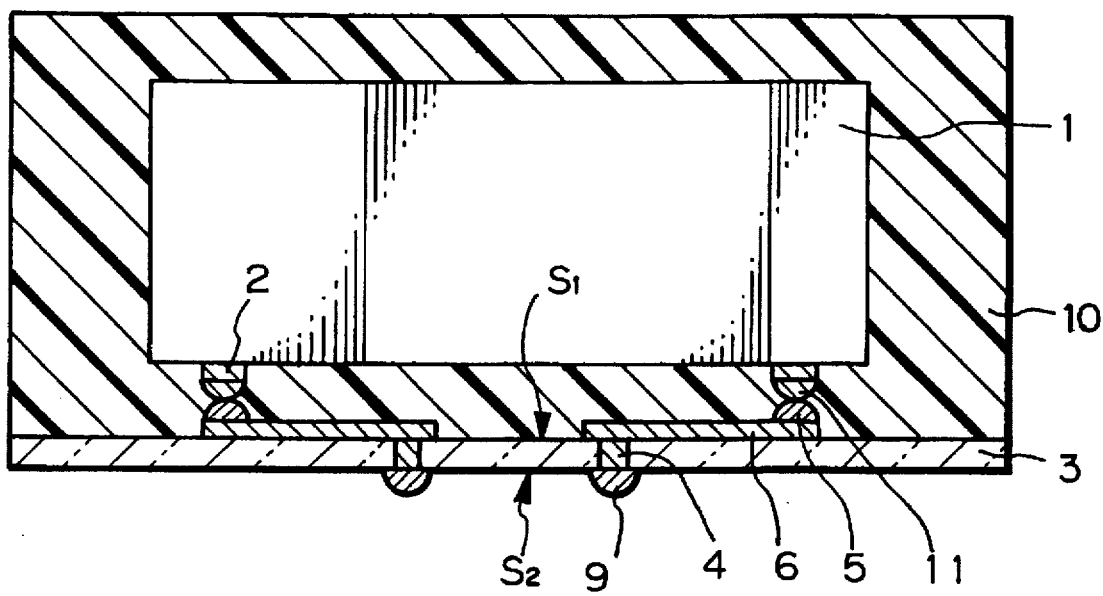
FIG. 4 is a cross-sectional view illustrating a modification of the device of FIG. 3.

In FIG. 4, which is a modification of the device of FIG. 3 (see: JP-A-HEI5-82586), transfer molding using resin is introduced to improve the contact characteristics of the chip 1 to the insulating film 3. That is, the chip 1 is entirely covered by resin indicated by reference numeral 10. In this case, in order to effectively transfer molding, other bumps 11 are added to the pads 2, thus enlarging a gap between the chip 1 and the insulating film 3.

In the device of FIG. 4, however, although the mechanical strength can be improved, there is a disadvantage in that the device is large in size due to the presence of resin and the enlarged gap between the chip 1 and the insulating film 3.

Figure 5A:
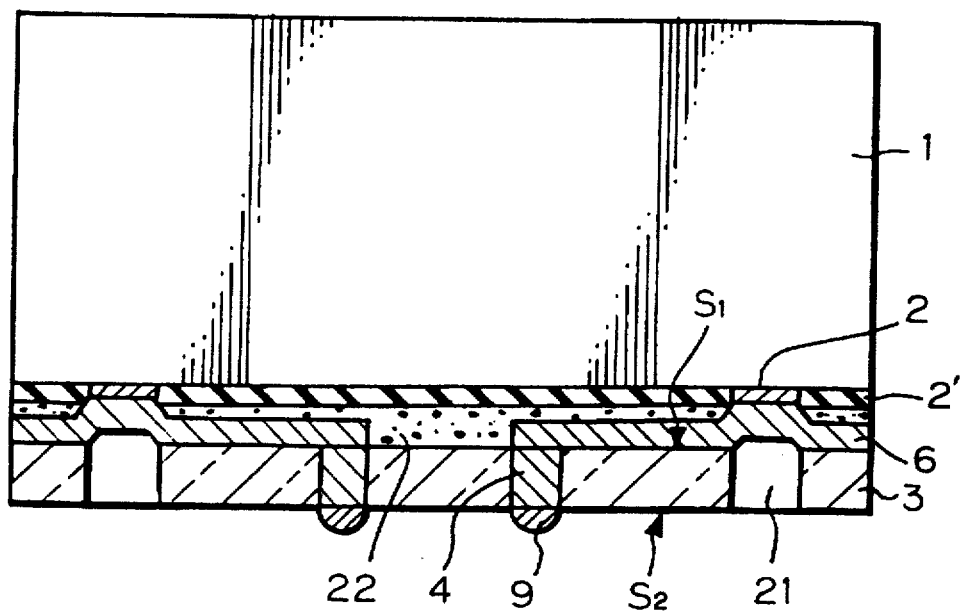
FIG. 5A is a cross-sectional view illustrating a first embodiment of the bump leaded film carrier type semiconductor device according to the present invention.
Figure 5B:
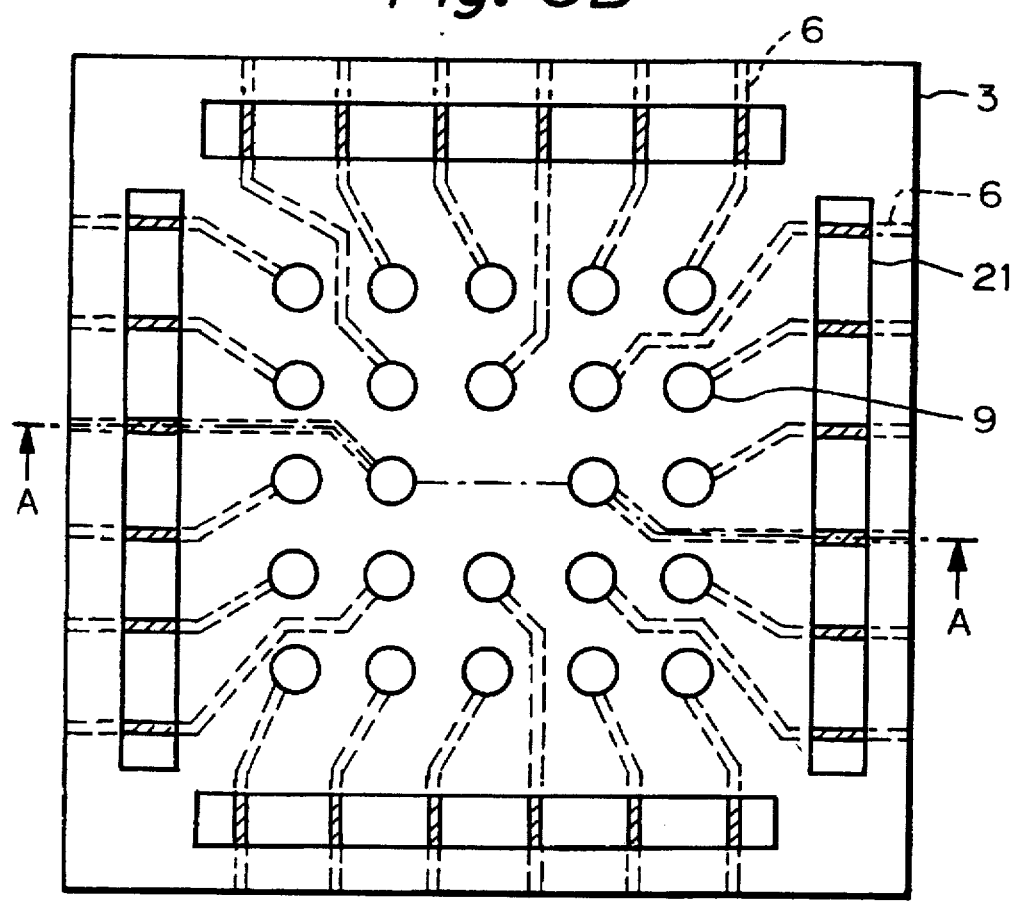
FIG. 5B is a bottom view of the device of FIG. 5A.

FIG. 5A is a cross-sectional view illustrating a first embodiment of the bump leaded film carrier type semiconductor device according to the present invention, and FIG. 5B is a bottom view of the device of FIG. 5A. Note that FIG. 5A is a cross-sectional view taken along the line A—A of FIG. 5B. In a similar way to that in FIG. 3, the conductive layers 6 are formed on the first surface $S_1$ of the insulating film 3. On the other hand, the bumps 9 made of solder are provided on the second surface $S_2$ of the insulating film 3. In this case, as illustrated in FIG. 5B, the bumps 9 are arranged in a grid having the same pitch, thus realizing an area array bonding system.

In FIGS. 5A and 5B, the bumps 5 of FIG. 3 are not provided. Instead of this, the conductive layers 6 are connected directly to the pads 2. For realizing such direct connection of the conductive layers 6 to the pads 2, openings 21 are provided in the insulating film 3, to locally press the conductive layers 6 to the pads 2. This will be explained later.

In FIGS. 5A and 5B, the chip 1 is bonded by an adhesive (tape) layer 22 to the insulating film 3, thus obtaining good contact characteristics of the chip 1 to the insulating film 3. Also, the adhesive layer 22 can be made thin, the device of FIGS. 5A and 5B can be small in size.

In FIG. 5A, note that reference numeral 2' designates a passivation layer for covering the chip 1, which is made of polyimide, silicon nitride or silicon oxide.

The manufacturing steps of the semiconductor devce of FIGS. 5A and 5B are explained next with reference to FIGS. 6A and 6B, 7A through 7H, and 8.

Figure 6A:
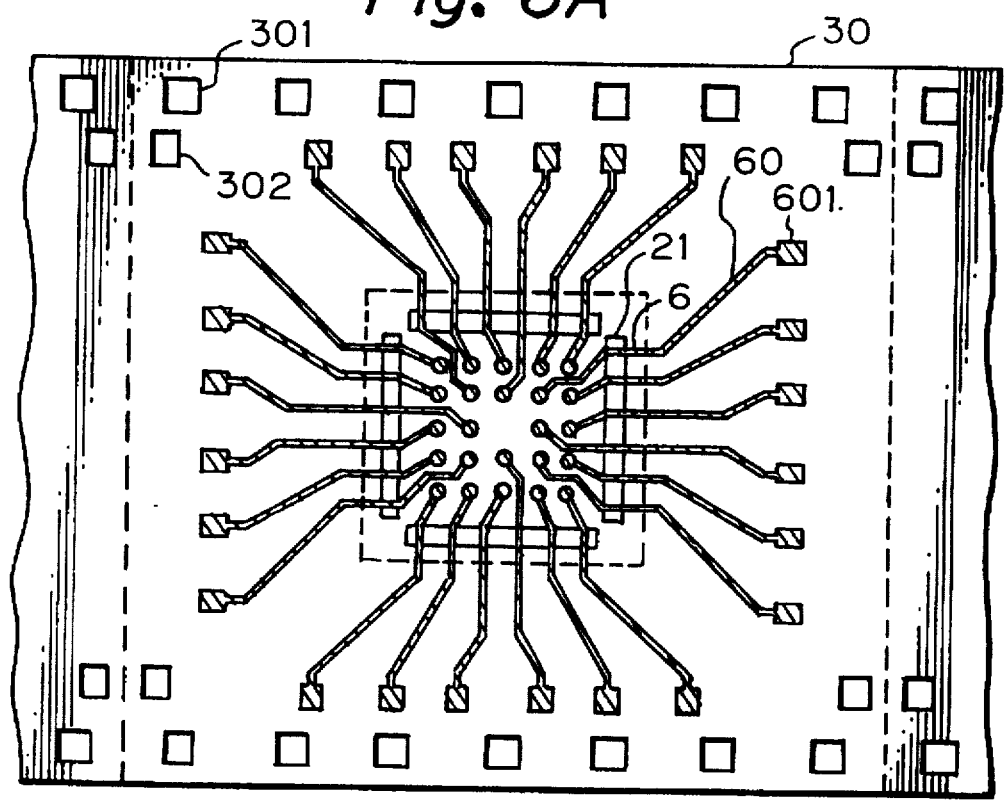
FIG. 6A is a plan view of a film carrier for explaining the manufacturing steps of the device of FIG. 5A.
Figure 6B:
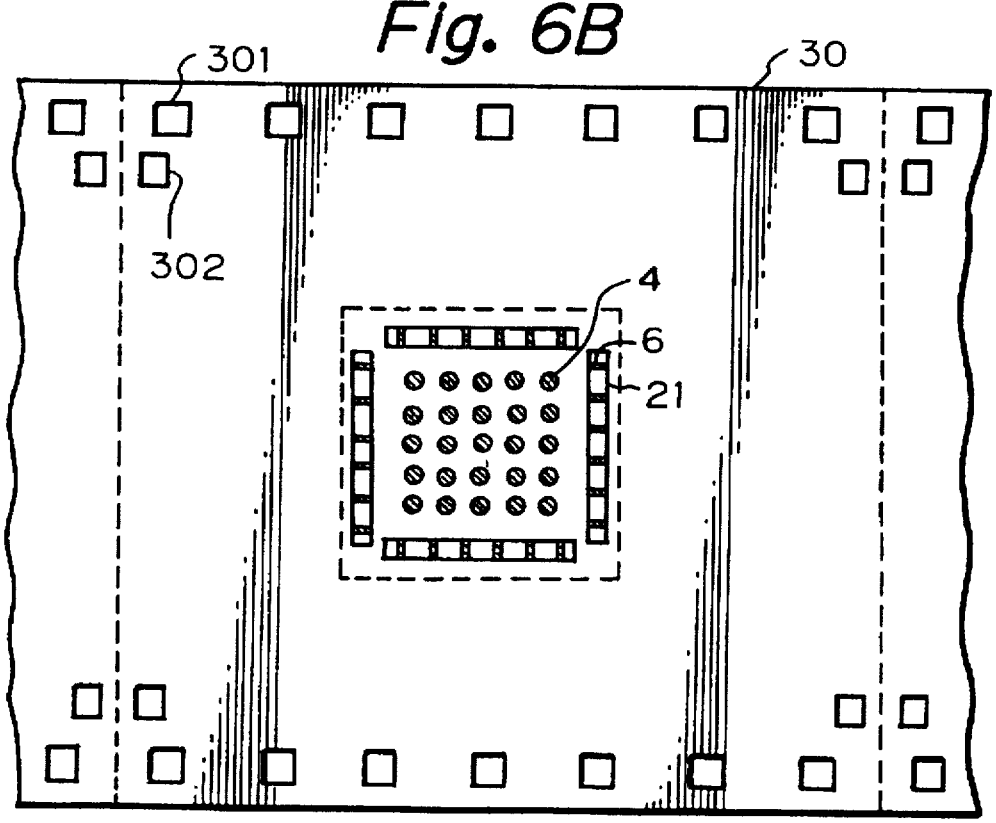
FIG. 6B is a bottom view of the film carrier of FIG. 6A.

First, a film carrier 30 as illustrated in FIGS. 6A and 6B is prepared. Note that FIG. 6A shows a conductive pattern side (first surface) of the film carrier 30, and FIG. 6B shows a substrate side (second surface) of the film carrier 30. That is, a conductive pattern 60 including the conductive layers 6 and test pads 601 is formed by using a photolithography and etching process on the first surface $S_1$ of the film carrier 30.

Then, the openings 21 and the through holes for the conductive members 4 are perforated by laser or etching in the film carrier 30. Then, the conductive members 4 are fitted into the through holes. In this case, the conductive members 4 are made of Au, Ni or Cu, preferably, Cu, since Au is expensive and Ni is easily cracked. Also, plating of flash gold (Au) or tin (Sn) is performed upon the conductive members 4. If gold is used, the thickness thereof is sufficiently thin, i.e., about 0.5 μm to improve the erosion characteristics. Then, the film carrier 30 is perforated to form sprocket holes 301 and alignment holes 302.

Note that, the conductive members 4 can be positively protruded on the horizontal direction on the second surface $S_2$ of the film carrier 30, to increase the land diameter of the bumps 9, thus strengthening the mechanical contact characteristics therebetween.

Next, referring to FIG. 7A, the film carrier 30 of FIGS. 6A and 6B is reversed and is arranged over the chip 1 which is also reversed. In this state, the adhesive tape 22 is interposed between the film carrier 30 and the chip 1.

Next, referring to FIG. 7B, the adhesive tape 22 is set on the chip 1. In this case, the adhesive tape 22 is made of thermoplastic resin, and the adhesive tape 22 is heated from the side of the chip 1 to a melting temperature, so that the adhesive tape 22 is provisionally fixed to the chip 1. Also, the setting and heating of the adhesive tape 22 is carried out to prevent a void from being trapped therein.

In FIG. 7B, note that it is possible that the adhesive tape 22 can be set on the film carrier 30.

Next, referring to FIG. 7C, a single point bonding system is used to carry out a bonding of inner leads, i.e., to bond the chip 1 to the film carrier 30. The single point bonding system using heat and ultrasonic waves has better heat transfer characteristics than a gang bonding system. That is, the Cu component of the conductive layers 6 of the conductive pattern 60 and the Al component of the pads 2 form alloy so that the conductive layers 6 are firmly bonded to the pads 2 of the chip 1.

Figure 7E:
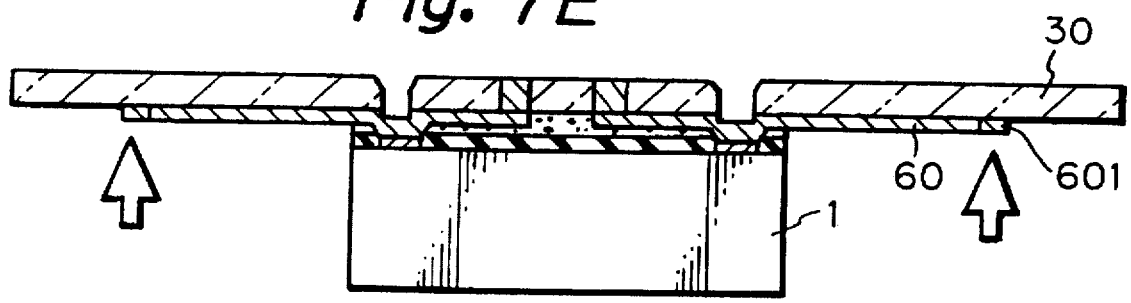
Figure 8:
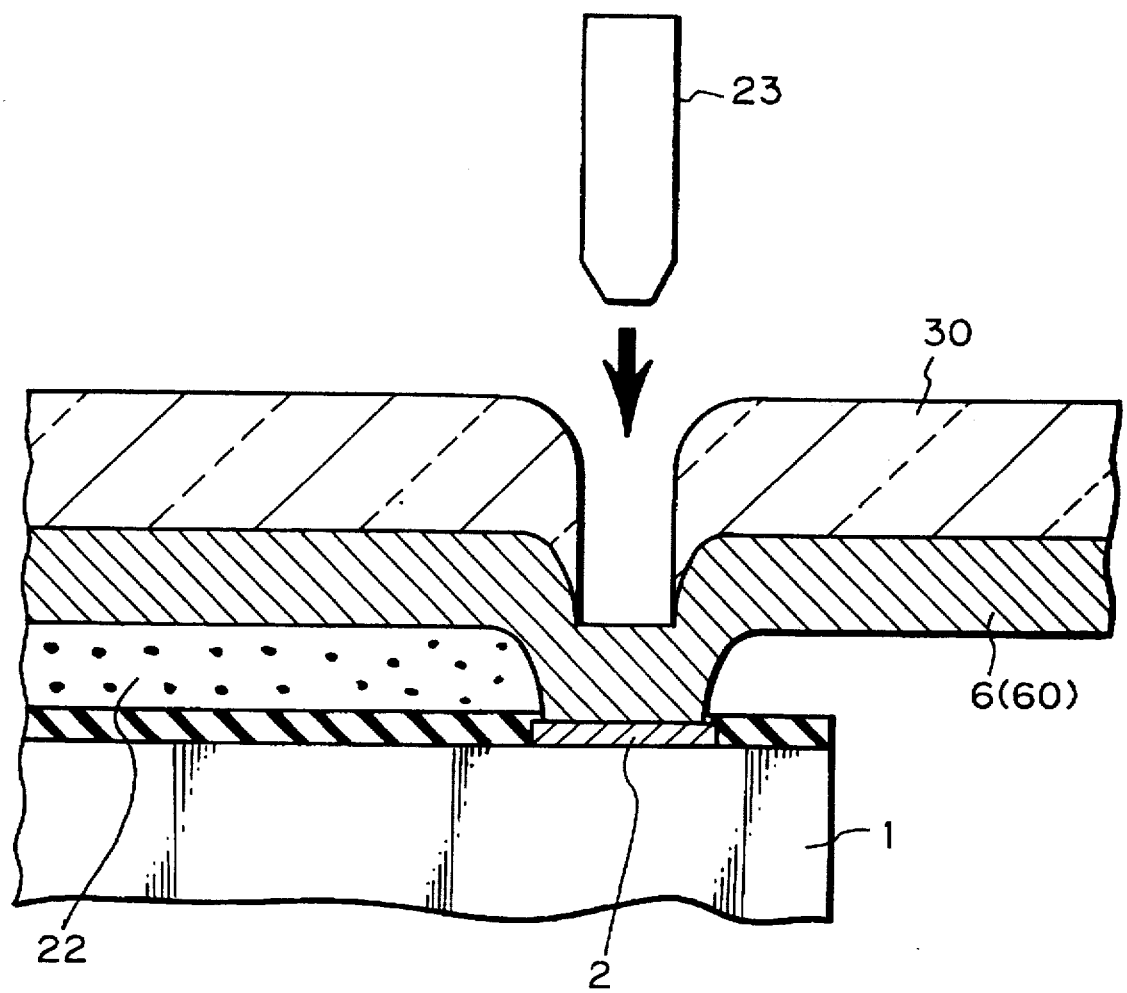
FIG. 8 is a partially-enlarged cross-sectional view of the device of FIG. 7C.

As illustrated in FIG. 8, which is a partial enlargement of FIG. 7C, the film carrier 30 is deformed by the thickness of the adhesive tape 22, but there is no problem due to the flexibility characteristics of the film carrier 30, which is made of organic material, and the extensible characteristics of the conductive layer 6. Also, when the temperature returns to room temperature, shrinkage is generated in the film carrier 30 due to the difference in thermal expansivity between the heated temperature and the room temperature. However, the flat characteristics of the film carrier 30 is not so deteriorated as compared with a gang bonding system where the surface of the chip 1 is usually heated up to about 500° C.

In FIG. 8, note that reference numeral 23 designates a bonding tool whose weight and operational time are controlled in accordance with the width of the conductive layer 6 and the like. Also, ultrasonic waves can be used for operating the bonding tool 23.

Next, referring to FIG. 7D, in order to firmly adhere the film carrier 30 to the chip 1 with the adhesive tape 22 therebetween, a heating and pressuring operation is carried out for few seconds from the tape side or the chip side. As a result, both of the film carrier 30 and the chip 1 are adhered to each other, and simultaneously, a component of the adhesive tape 22 is penetrated into the inner lead portions and extends to the outer periphery of the chip 1. Therefore, the adhesive tape 22 may be finally diffused into the entire chip 1. Also, sealing of an active region of the film carrier 30 and the inner lead portions, an insulation with the chip 1, and a shield effect for α-ray can be expected. Note that, even when a weight of several kg/cm$^2$ is applied to the entire device and the temperature is about 300° C., no adverse effects such as cracking of the chip 1 and the inner lead portions is recognized. Also, in this step, provided between the solder bump mounting face of the film carrier 30 and a mounting head (not shown) are fluorocarbon polymers or ceramic having flat characteristics, to prevent the solder bump mounting face from being contaminated.

Next, referring to FIG. 7E, a test is carried out by supplying electrical signals to the test pads 601 of the conductive pattern 60.

Figure 7F:
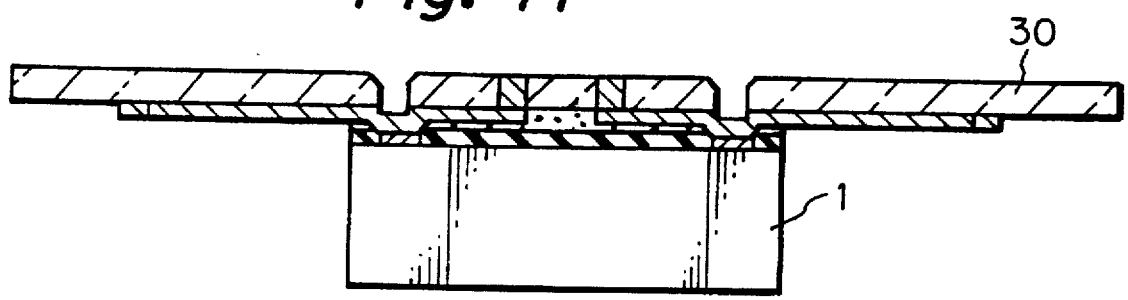

Next, referring to FIG. 7F, the periphery of the chip 1 is cut by using a metal die (not shown). For example, a cutting operation is carried out in view of a 100 μm edge allowance, however, it is possible to carry out a precise cutting operation by laser or dicing. Thus, the insulating film 3 is left.

Figure 7G:
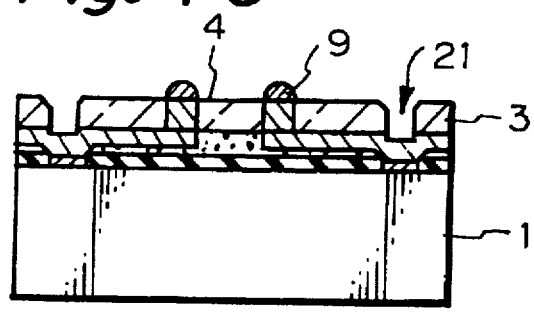

Finally, referring to FIG. 7G, the bumps 9 made of solder are formed on the conductive members 4. For example, balls are formed by using a wire bonding method on a wire made by solder, and the balls are bonded on the conductive menbers 4. After that, the wire is cut so that the balls are left to form the bumps 9. Also, as bump forming material, indium capable of low temperature bonding can be used instead of solder. Further, the formation of the bumps is carried out at a step for preparing the film carrier 30 as illustrated in FIGS. 6A and 6B.

Thus, the device of FIGS. 5A and 5B is completed.

Figure 7H:
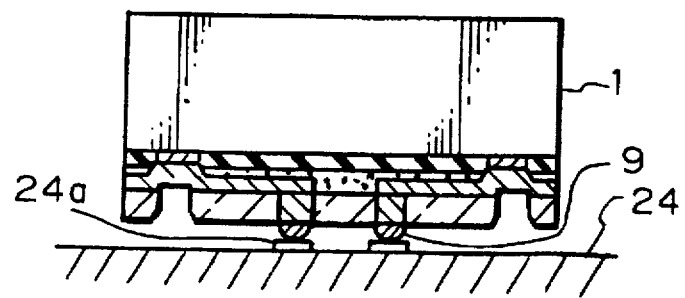

Additionally, referring to FIG. 7H, the device of FIG. 7G is provisionally mounted on a mounting substrate 24 by using a high precision mounter (not shown). The solder bumps 9 are aligned with lands 24a of the mounting substrate 24 by using an optical system, and a weight is applied with heating, to carry out a provisional nounting of the device. After that, a proper bonding is carried out in a reflow furnace. Also, in a case where the diameter of the solder bumps 9 and the diameter of the lands 24a are large, it is sufficient to align the bumps 9 with the lands 24a due to the self-alignment effect of solder by setting the assembly in an alignment tool and putting it in a furnace. Note that, the pitch of pads for the outer leads is preferably about 0.5 mm in view of the mounting characteristics. Also, if solder is also formed on the mounting substrate 24, it is possible to increase the distance between the insulating film 3 and the substrate 24.

Also, at the step as illustrated in FIG. 7G, it is possible to fit fillers made of resin into the openings 21.

Figure 9A:
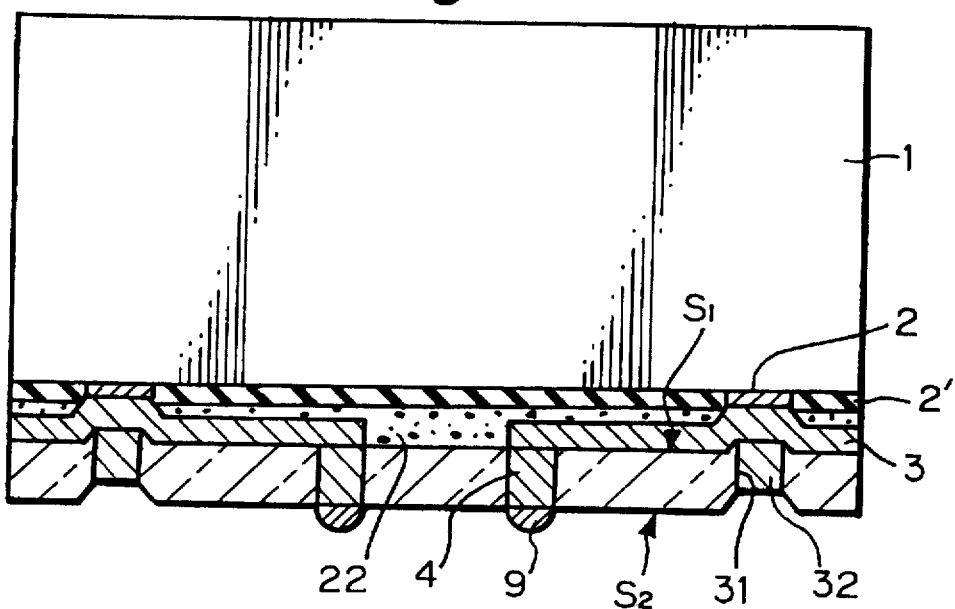
FIG. 9A is a cross-sectional view illustrating a second embodiment of the bump leaded film carrier type semiconductor device according to the present invention.
Figure 9B:
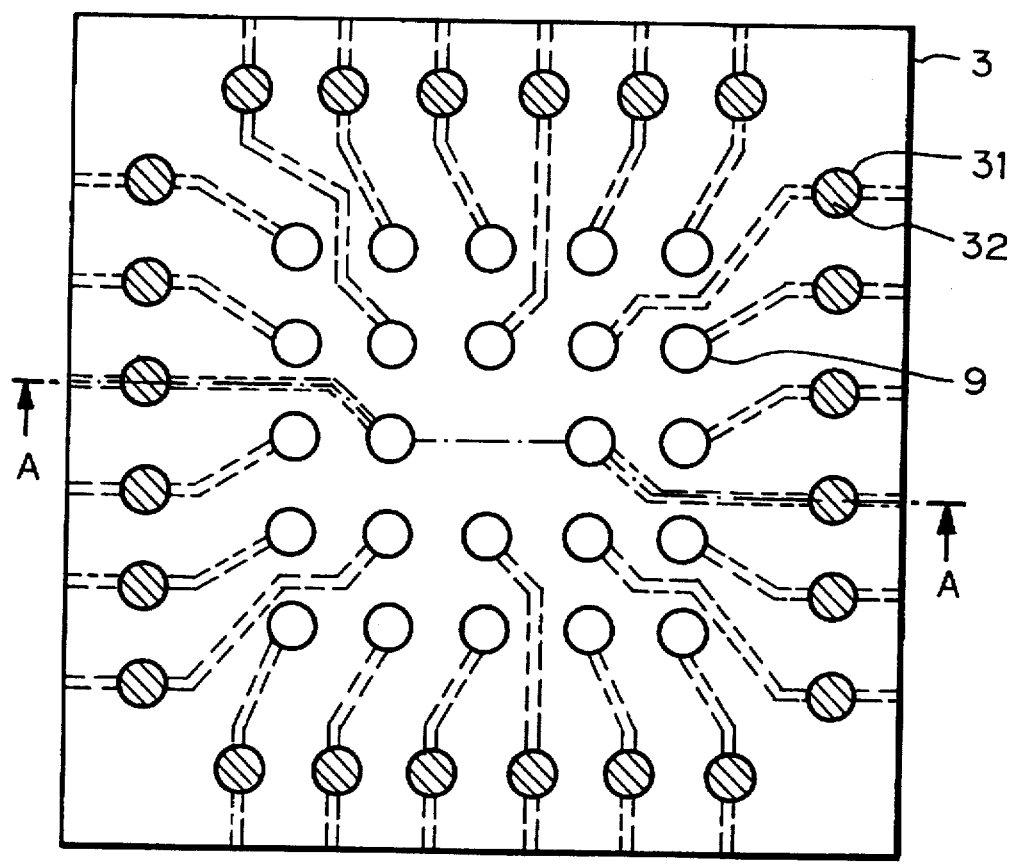
FIG. 9B is a bottom view of the device of FIG. 9A.

FIG. 9A is a cross-sectional view illustrating a second embodiment of the bump leaded film carrier type semiconductor device according to the present invention, and FIG. 9B is a bottom view of the device of FIG. 9A. Note that FIG. 9A is a cross-sectional view taken along the line A—A of FIG. 9B. In FIGS. 9A and 9B, through holes 31 are provided in the insulating film 3 instead of the openings 21 of FIGS. 5A and 5B. Fillers 32 made of metal are fitted into the through holes 31. Therefore, when bonding inner leads by a bonding tool, the bonding tool can easily push each of the conductive layers 6 via a respective one of the fillers 32. Also, the through hole 31 can be precisely formed in alignment with the pads 2 of the chip 1 and the conductive layers 6. Further, the mechanical strength in the inner lead portions can be strengthened. Still further, since energy is transmitted effectively from the fillers 32 to the inner lead portions, the bonding condition of the inner leads can be relaxed.

The manufacturing steps of the semiconductor device of FIGS. 9A and 9B are explained next with reference to FIGS. 10A and 10B, 11A through 11H, and 12, which correspond to FIGS. 6A and 6B, 7A through 7H, and 8, respectively.

Figure 10A:
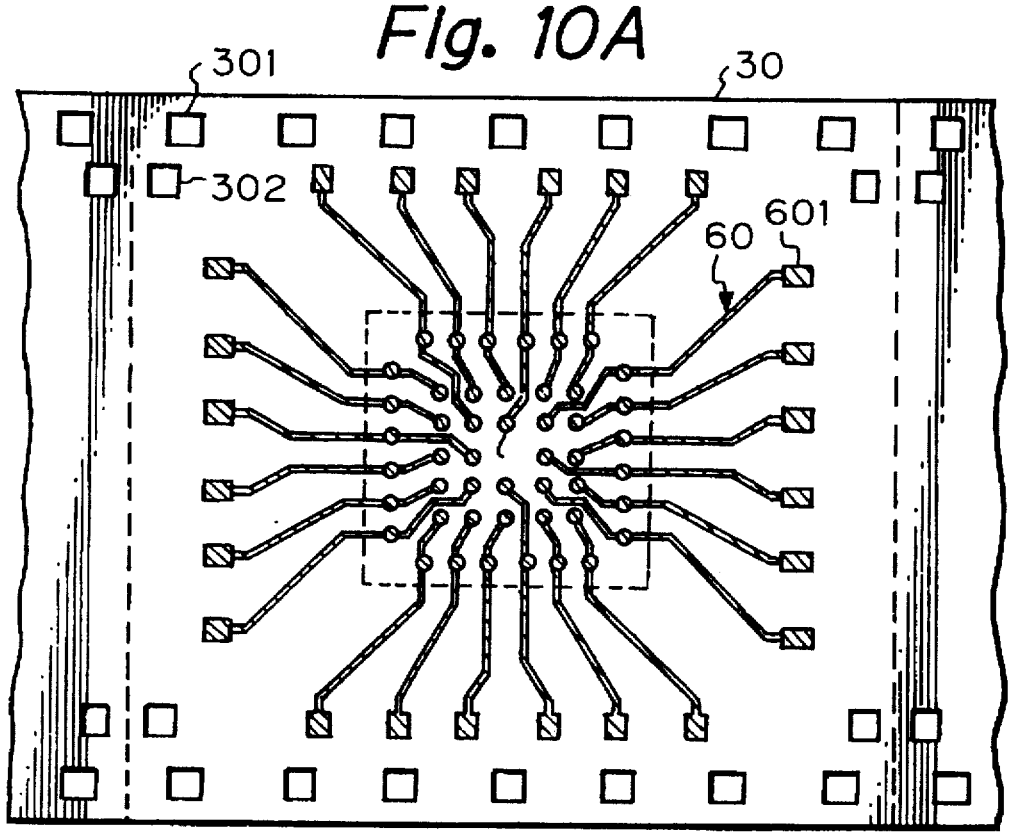
FIG. 10A is a plan view of a film carrier for explaining the manufacturing steps of the device of FIG. 9A.
Figure 10B:
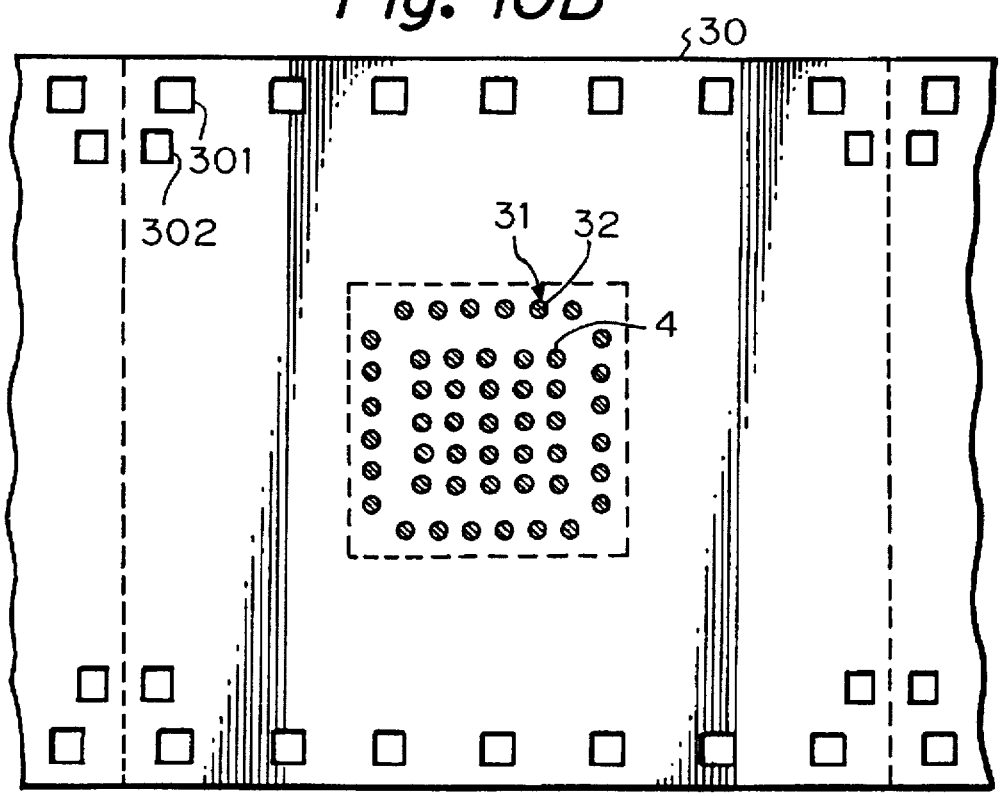
FIG. 10B is a bottom view of the film carrier of FIG. 9A.

As shown in FIGS. 10A and 10B, the through holes 31 and the fillers 32 therein are provided instead of the openings 21 of FIGS. 6A and 6B. In this case, the through holes 31 formed by laser or an etching process have to be in alignment with the conductive layers 6. For example, if the pads 2 are arranged at a pitch of 100 μm on the chip 1, the pitch of the through holes 31 is also 100 μm. Also, the width of the conductive layers 6 is as large as possible in view of the alignment with the through holes 31. On the other hand, the width of the conductive layers 6 is as small as possible in view of the prevention of short circuits around the conductive member 4 (or the bumps 9) in a grid. For example, if the width of the conductive layers 6 is about 70 μm, the through holes 31 are 50 μm in diameter. Also, in order to precisely form the through holes 31, the film carrier 30 is as thin as possible.

In the manufacturing steps as shown in FIGS. 11A through 11H, a single point bonding system is adopted, which is different from those as shown in FIGS. 7A through 7H. The single point bonding system is shown in detail in FIGS. 11C and 12. That is, a bonding tool 23 is provided for each of the fillers 32, i.e., each of the conductive layers 6. Also, in this case, the surface of the chip 1 is heated up to about 300° C.

Figure 13A:
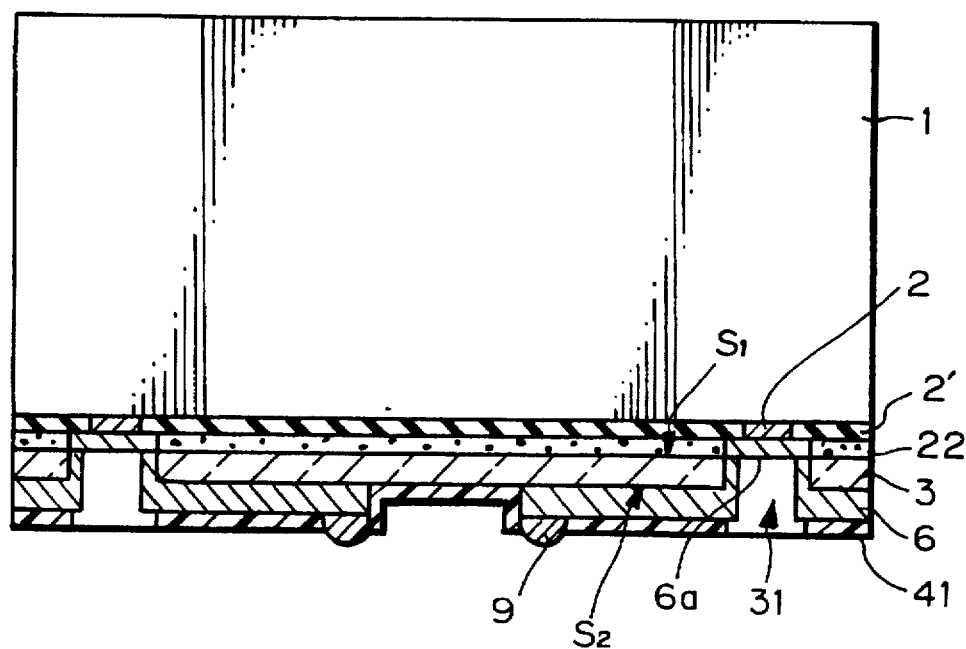
FIG. 13A is a cross-sectional view illustrating a third embodiment of the bump leaded film carrier type semiconductor device according to the present invention.
Figure 13B:
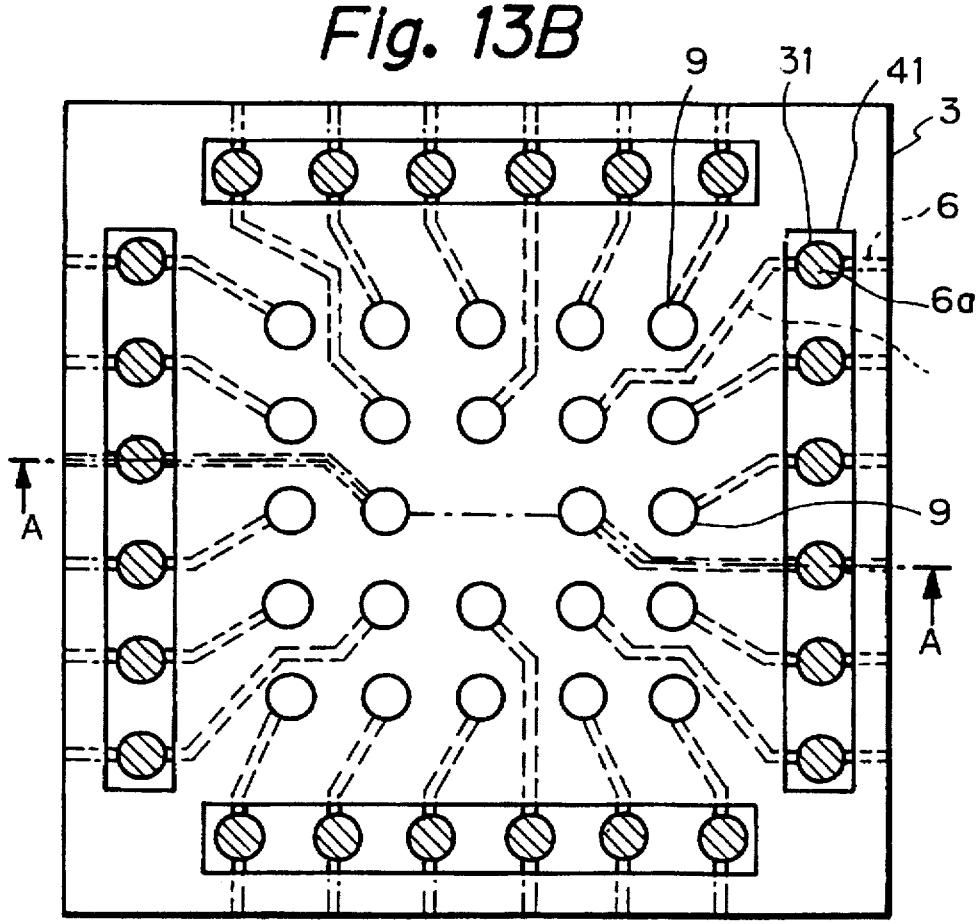
FIG. 13B is a bottom view of the device of FIG. 13A.

FIG. 13A is a cross-sectional view illustrating a third embodiment of the bump leaded film carrier type semiconductor device according to the present invention, and FIG. 13B is a bottom view of the device of FIG. 13A. Note that FIG. 13A is a cross-sectional view taken along the line A—A of FIG. 13B. In FIGS. 13A and 13B, the conductive layers 6 are provided on the second surface $S_2$ of the insulating film 3. Also, parts of the conductive layers 6 extend via the through holes 31 to the first surface $S_1$ of the insulating film 3 and correspond to the pads 2 of the chip 1. In this case, the conductive layers 6 on the first surface $S_1$ is etched to form pads 6a corresponding to the pads 2. Note that the part of the conductive layers 6 in the through holes 31 can be formed by plating. Further, a cover 41 made of resin or polyimide is coated on the conductive layers 6 on the side of the second surface $S_2$, to electrically protect the conductive layers 6.

Therefore, in the third embodiment, short circuits due to the contact of the conductive layers 6 to the outer periphery of the chip 1 are hardly generated. Also, since an insulating distance between the chip 1 and the conductive layers 6 is substantially increased, there is an advantage in electrical characteristics.

Figure 14A:
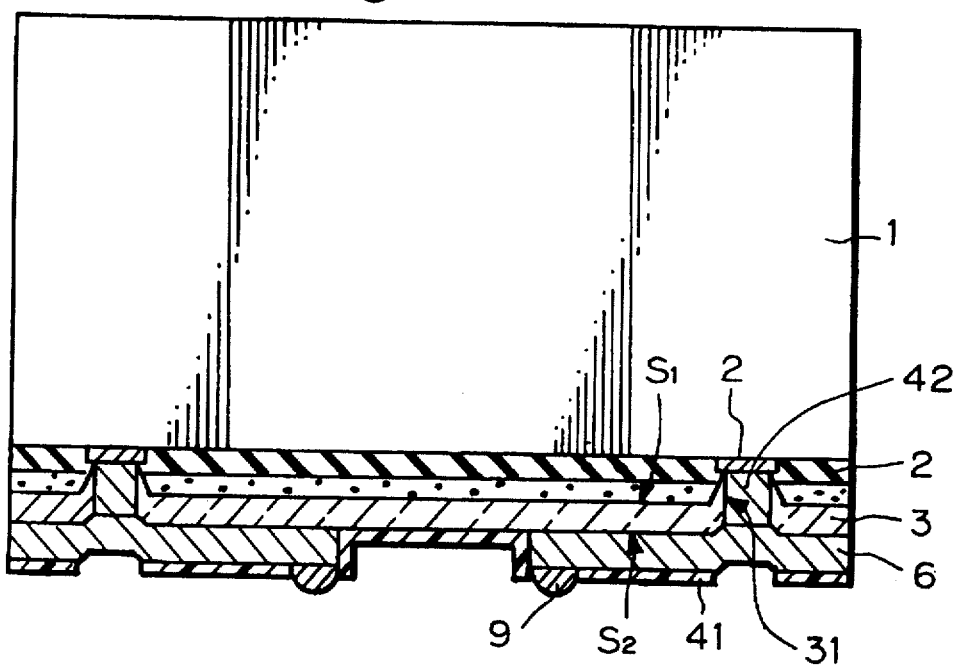
FIG. 14A is a cross-sectional view illustrating a fourth embodiment of the bump leaded film carrier type semiconductor device according to the present invention.
Figure 14B:
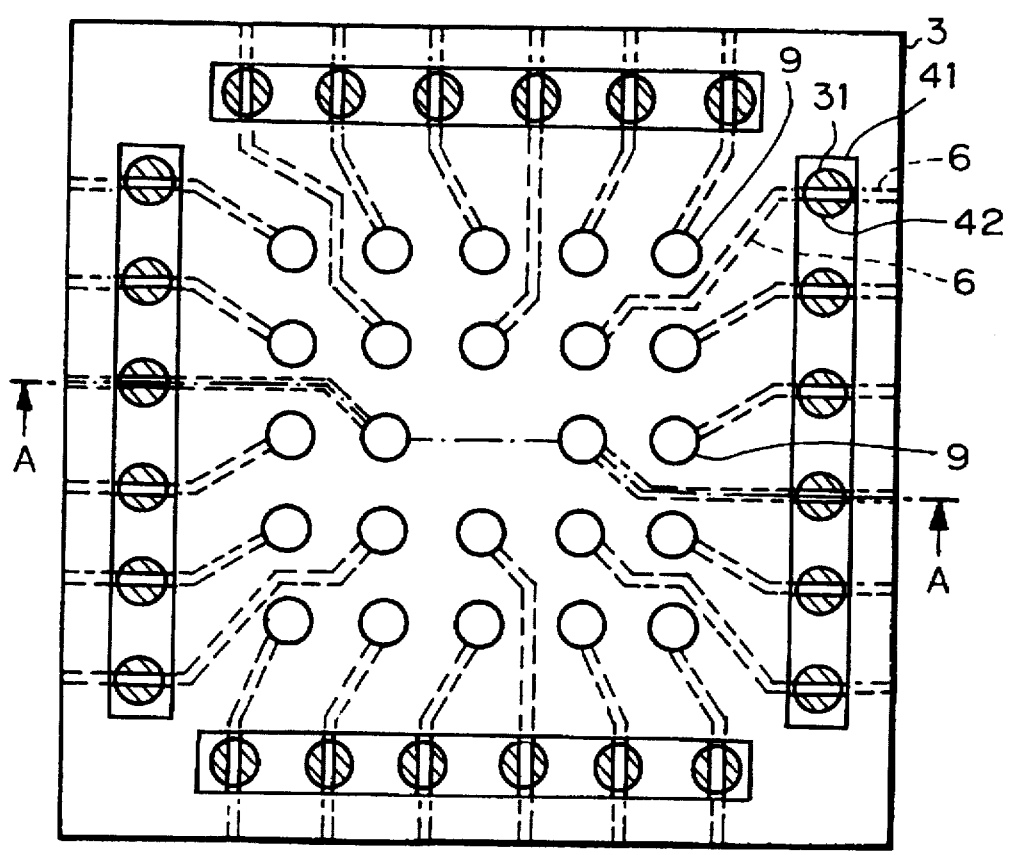
FIG. 14B is a bottom view of the device of FIG. 14A.

FIG. 14A is a cross-sectional view illustrating a fourth embodiment of the bump leaded film carrier type semiconductor device according to the present invention, and FIG. 14B is a bottom view of the device of FIG. 14A. Note that FIG. 14A is a cross-sectional view taken along the line A—A of FIG. 14B. The fourth embodiment is similar to the third embodiment. That is, in FIGS. 14A and 14B, fillers 42 made of metal are inserted between the pads 2 and the conductive layers 6, to easily push the conductive layers 6 by the bonding tool 23' (see FIG. 12). Also, the metal fillers 42 can be easily formed by solder bumps using a solder bump system. Therefore, the metal fillers 42 are advantageous in shear strength as compared with the parts 6a of the conductive layers 6 of the third embodiment.

Figure 15A:
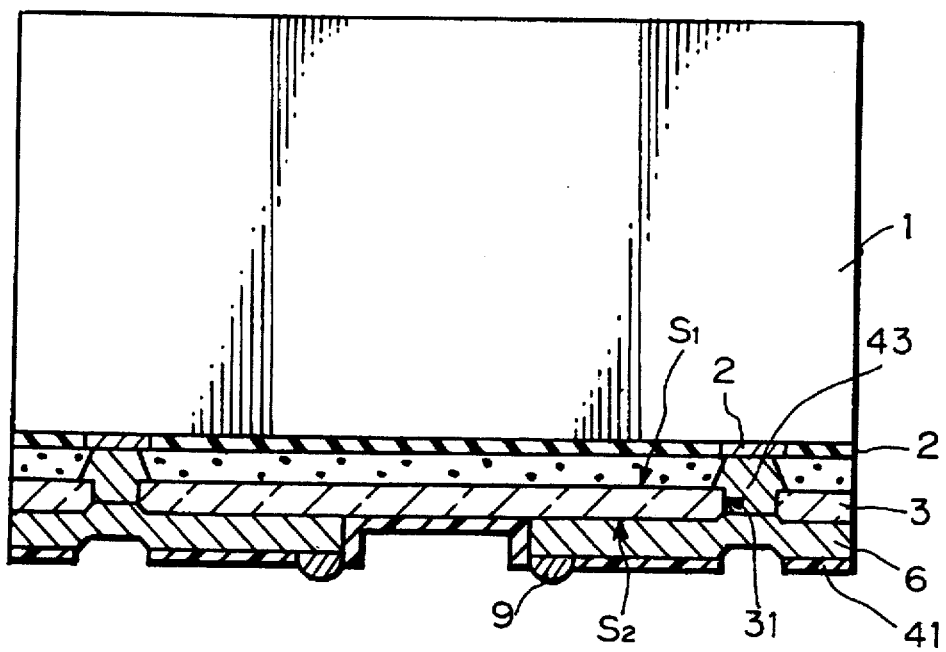
FIG. 15A is a cross-sectional view illustrating a fifth embodiment of the bump leaded film carrier type semiconductor device according to the present invention.
Figure 15B:
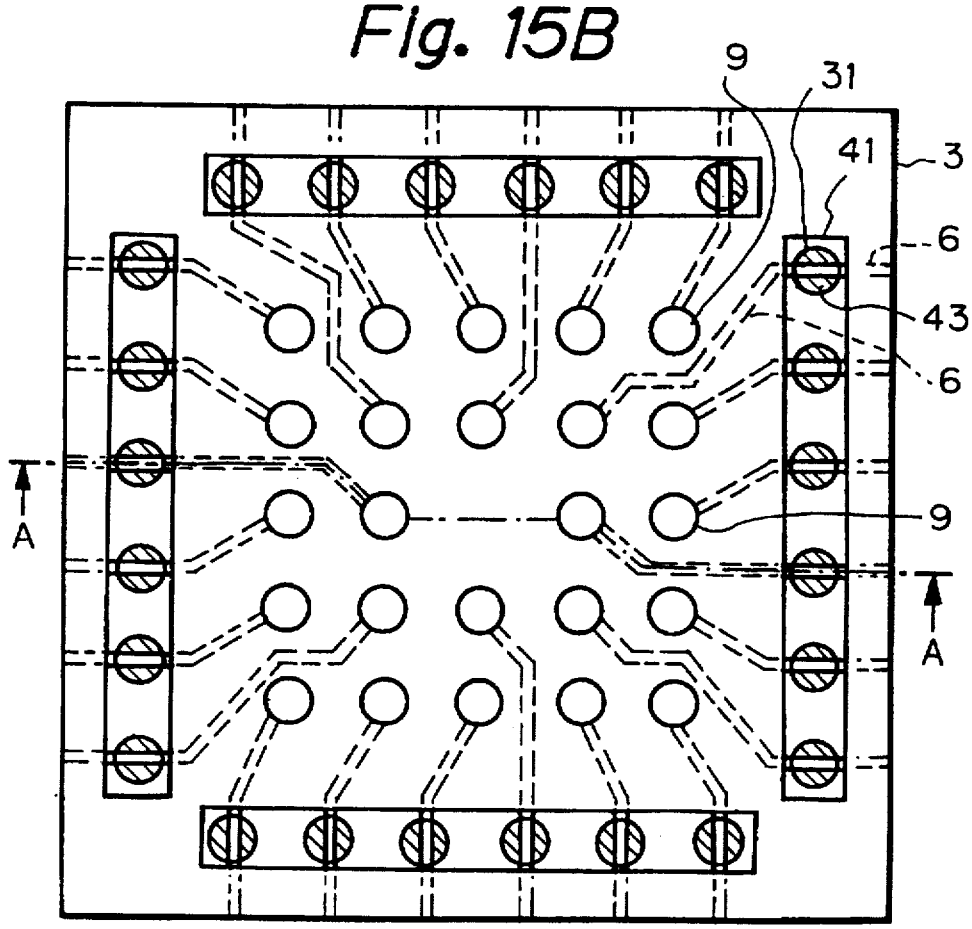
FIG. 15B is a bottom view of the device of FIG. 15A.

FIG. 15A is a cross-sectional view illustrating a fifth embodiment of the bump leaded film carrier type semiconductor device according to the present invention, and FIG. 15B is a bottom view of the device of FIG. 15A. Note that FIG. 15A is a cross-sectional view taken along the line A—A of FIG. 15B. The fifth embodiment is similar to the fourth embodiment. That is, in FIGS. 15A and 15B, metal fillers 43 are positively protruded along the horizontal direction on the first surface $S_1$ of the insulating film 3. As a result, the thickness of the insulating film 3 can be reduced more in the fifth embodiment than in the fourth embodiment, thus reducing the device in size.

Figure 16A:
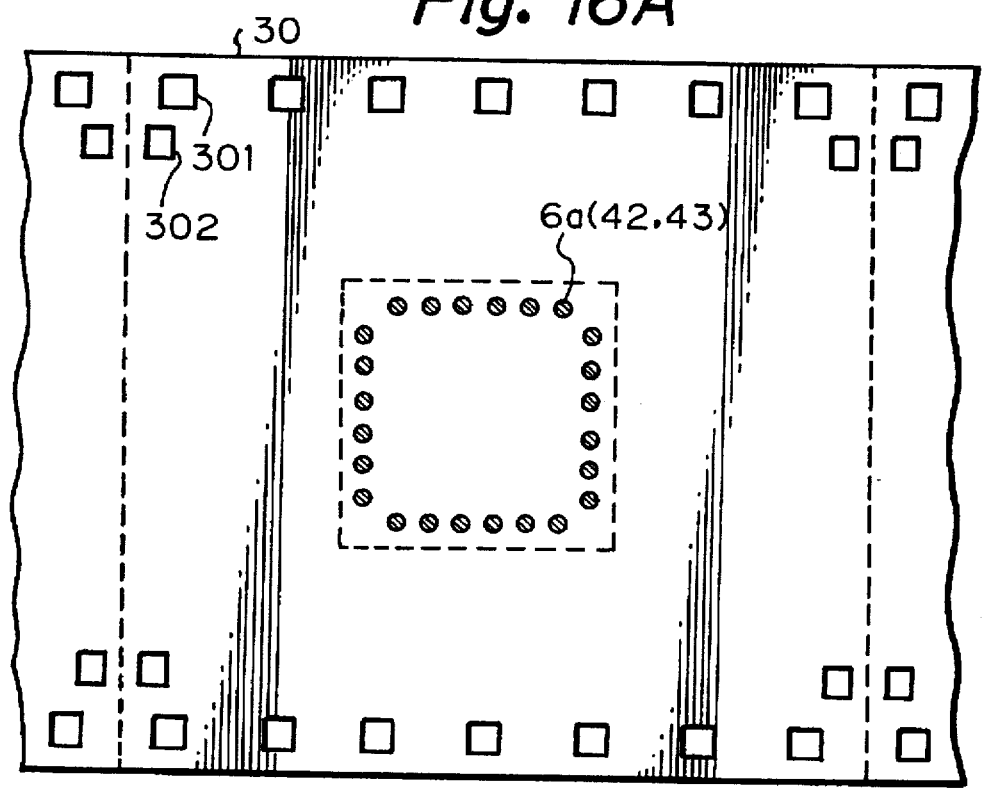
FIG. 16A is a plan view of the insulating film of FIGS. 13A, 13B, 14A, 14B, 15A and 15B.
Figure 16B:
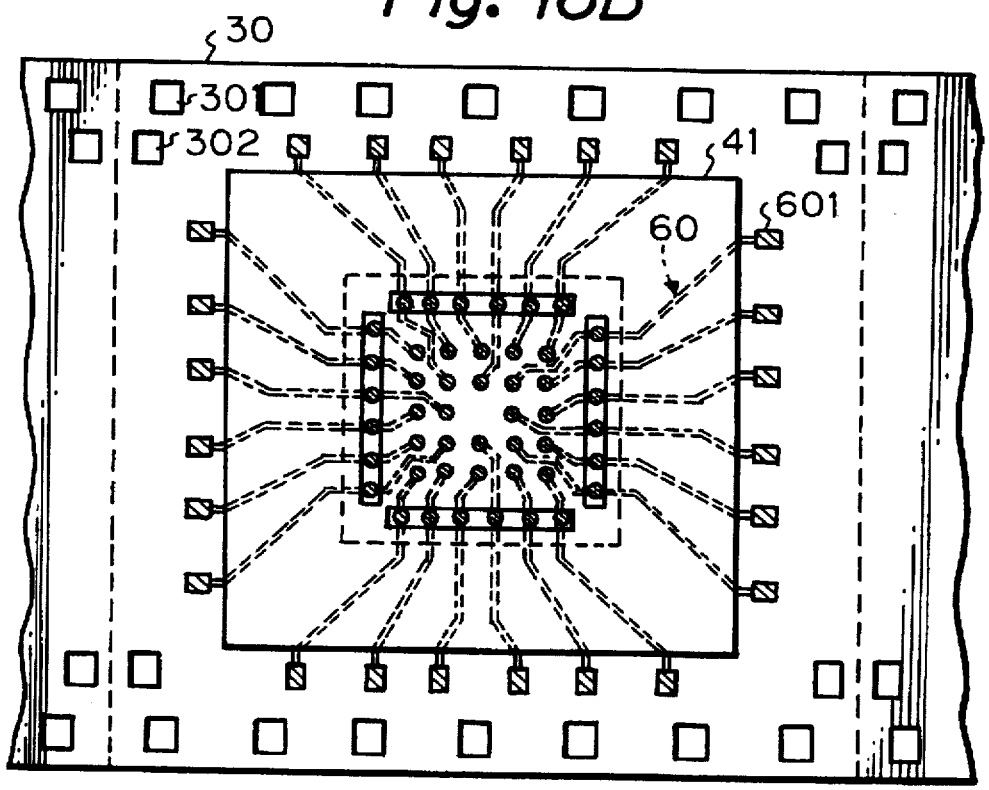
FIG. 16B is a bottom view of the insulating film of FIGS. 13A, 13B, 14A, 14B, 15A and 15B.

FIGS. 16A and 16B show a film carrier 30 used for manufacturing the devices of FIGS. 13A, 13B, 14A, 14B, 15A and 15B. In this case, FIG. 16A shows a chip side surface (first surface) of the film carrier 30, and FIG. 16B shows a conductive pattern side (second surface) of the film carrier 30. Since the conductive layers 6 are located on the second surface $S_2$ of the film carrier 30, the cover 41 covers the conductive layers 6 except for the inner lead portions and the test pads 601 thereof, which is different from the film carriers as shown in FIGS. 5A, 5B, 10A and 10B.

In the above-described embodiments, the adhesive (tape) layer 22 can be made of thermosetting resin or thermoplastic resin. Thermoplastic polyimide is polymer coupled by imid coupling of aromatic molecules, so that a heat resistance of higher than 400° C. is obtained. Also, the mutual interruption of molecules of the thermoplastic resin is weak, and therefore, the thermoplastic resin has thermal flowability. Also, the glass transition temperature of the thermoplastic resin for defining the thermal flowability can be arbitrarily controlled. Thus, thermoplastic resin rather than thermosetting resin is preferable for the adhesive (tape) layer 22. Further, since a bonding between the chip 1 and the insulating film 3 is carried out at a low temperature and a low pressure, thermoplastic resin is preferable. However, other heat-resistant adhesive film and thermosetting polyimide capable of high speed curing can be used as the adhesive (tape) layer 22.

On the other hand, organic material of the adhesive layer 22 is adhered to conductive portions such as the pads 2, the conductive layers 6 and the like, thus deteriorating the reliability. To avoid this, the size of the adhesive layer 22 should be smaller than that of the chip 1. Also, the adhesive layer 22 is as thin as possible, to reduce a step between the chip 1 and the insulating film 3. For example, the adhesive layer 22 is preferably about 10 to 30 μm.

Thus, according to the first to fifth embodiments, since the flexible insulating film 3 is interposed between the chip 1 and the substrate 24, a stress generated due to the difference in thermal expansibility rate therebetween can be relaxed. In the prior art flip-chip bonding system, a height of about 100 μm is required and insertion of liquid resin into gaps is indispensible, while, in the above-described embodiments, since the height after bonding can be smaller than about 50 μm, the diameter of the bumps 9 can be smaller than about 80 μm in diameter in view of the warpage of the substrate 24. Also, even when the device is mounted without resin sealing on a printed substrate having a large difference in thermal extensibility rate, it is possible to pass a temperature cycle test (300 cycles of —25° C./30 minutes and 125° C./30 minutes). Further, since the film carrier 30 and the adhesive layer 22 serve as a cover against solder flux, the residual flux left by insufficient cleaning can be compensated for.

Figure 17A:
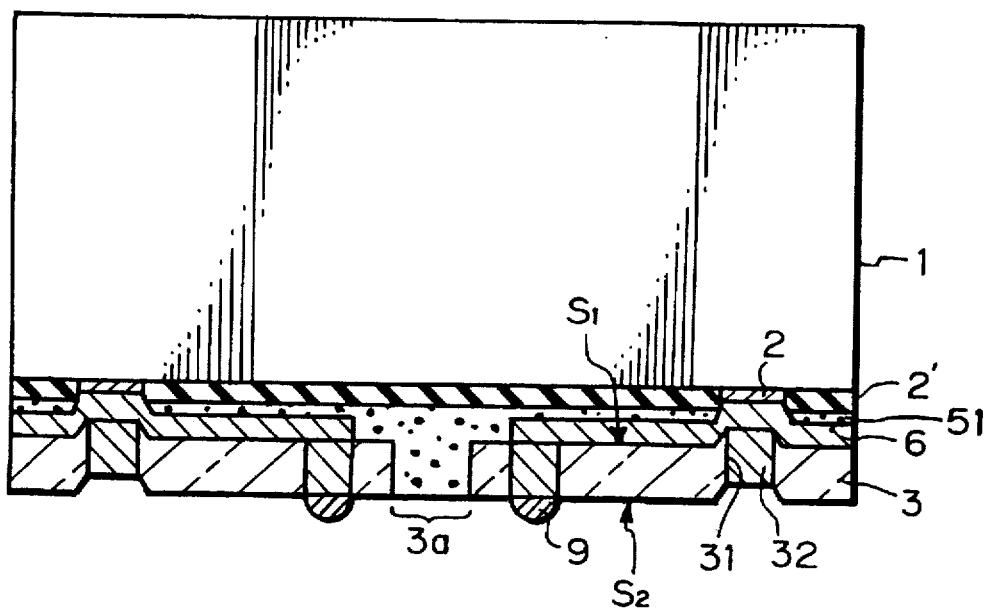
FIG. 17A is a cross-sectional view illustrating a sixth embodiment of the bump leaded film carrier type semiconductor device according to the present invention.
Figure 17B:
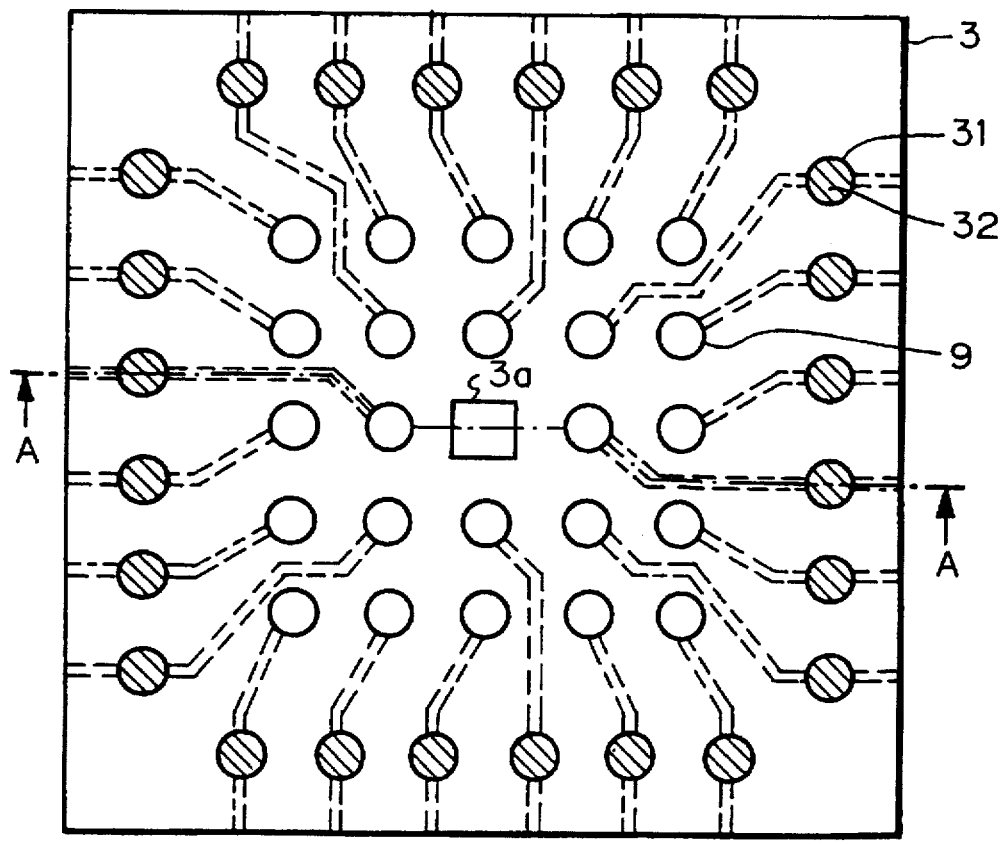
FIG. 17B is a bottom view of the device of FIG. 17A.

FIG. 17A is a cross-sectional view illustrating a sixth embodiment of the bump leaded film carrier type semiconductor device according to the present invention, and FIG. 17B is a bottom view of the device of FIG. 17A. Note that FIG. 17A is a cross-sectional view taken along the line A—A of FIG. 17B. In FIGS. 17A and 17B, a resin injection opening 3a is perforated at a center of the insulating film 3 of FIGS. 9A and 9B. That is, liquid resin is injected via the resin injection opening 3a into a gap between the chip 1 and the insulating film 3, to thereby form a resin layer 51 instead of the adhesive layer 22 of FIGS. 9A and 9B.

The manufacturing steps of the semiconductor device of FIGS. 17A and 17B are explained next with reference to FIGS. 18A through 18G which correspond to FIGS. 11A, 11C through 11H, respectively.

Figure 11A:
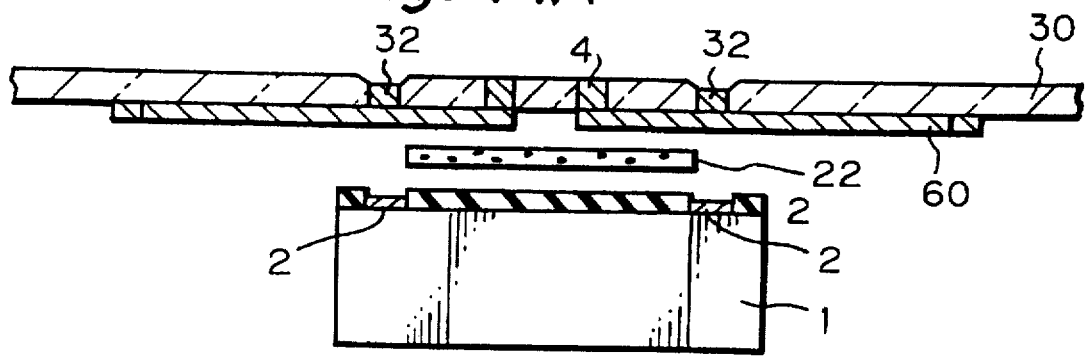
FIGS. 11A through 11H are cross-sectional views for explaining the manufacturing steps of the device of FIG. 9A.
Figure 11B:
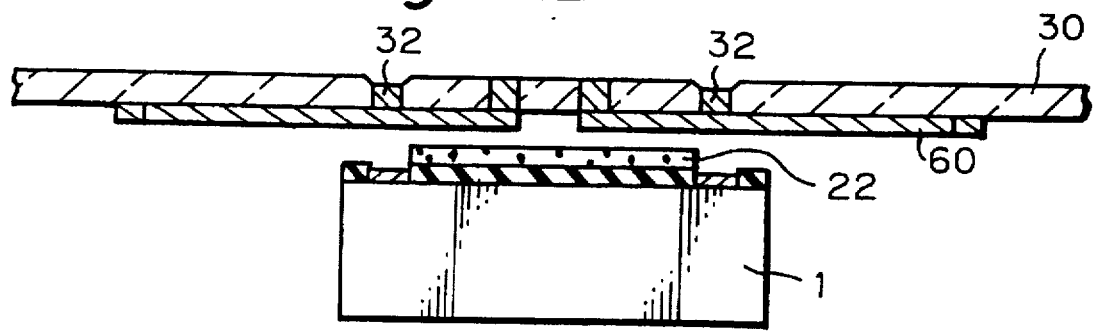
Figure 18A:
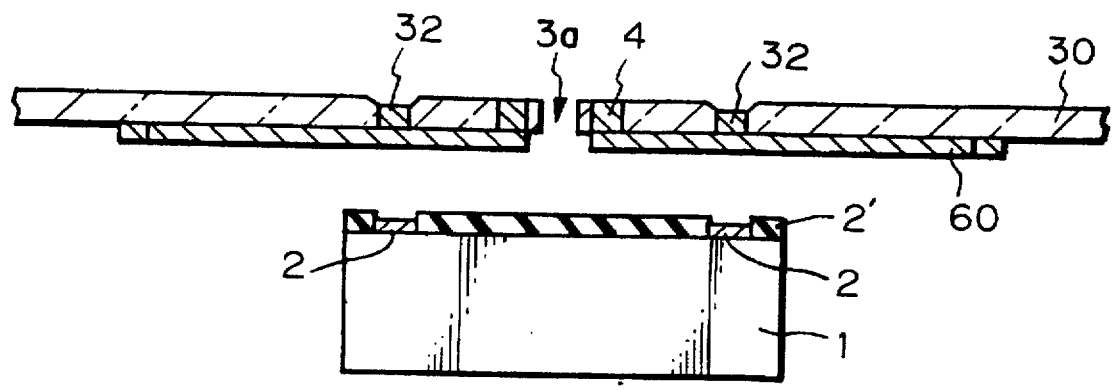
FIGS. 18A through 18G are cross-sectional views for explaining the manufacturing steps of the device of FIG. 17A.

First, referring to FIG. 18A, in a similar way as that in FIG. 11A, the film carrier 30 similar to that as shown in FIGS. 6A and 6B except for the resin injection opening 3a is reversed and is arranged over the chip 1 which is also reversed.

Figure 11C:
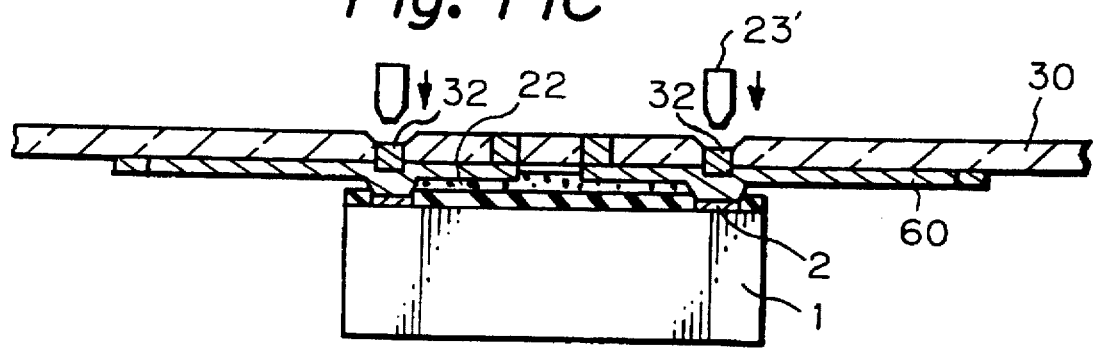
Figure 18B:
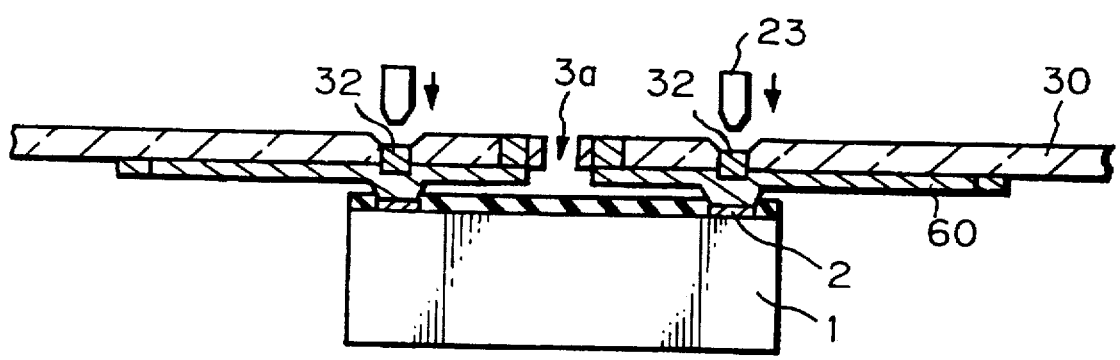

Next, referring to FIG. 18B, in the same way as in FIG. 11C, a single point bonding system is used to carry out a bonding of inner leads, i.e., to bond the chip 1 to the film carrier 30.

Figure 18C:
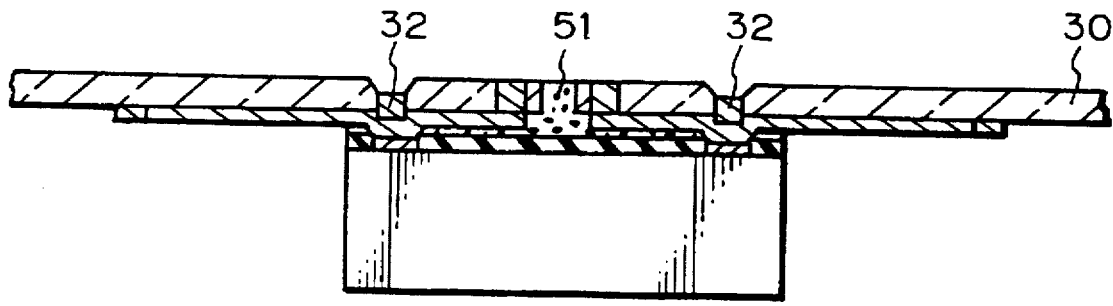
Figure 18D:
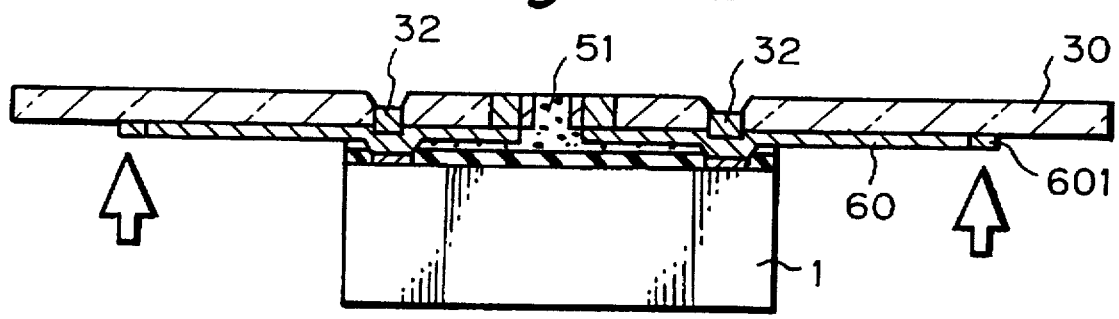
Figure 18E:
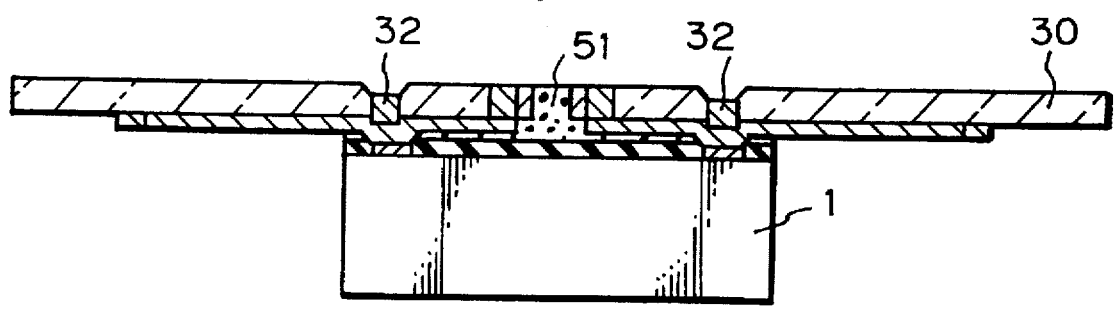
Figure 18F:
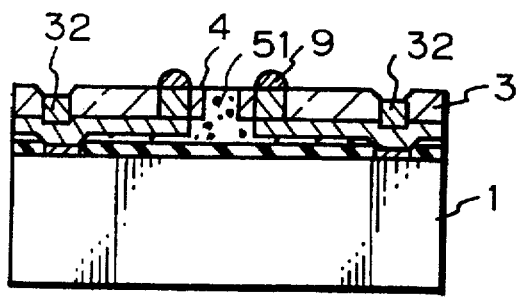
Figure 18G:
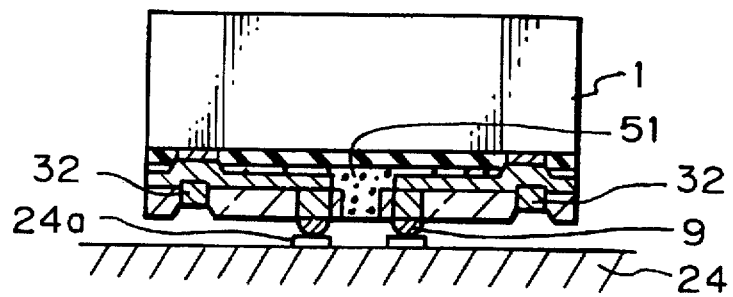

Next, referring to FIG. 18C, resin for sealing is injected via the resin injection opening 51 into a gap between the chip 1 and the film carrier 30, to form the resin layer 51. In this case, this resin is preferably one having a suitable flowability and is capable of forming a thin coating film. Although epoxy, silicon, silicon epoxy, fluorocarbon polymers and the like are considered as such a resin, silicon and fluorocarbon polymers are preferable due to their rubber characteristics after curing. Further, in order to reduce the shrinkage of the film carrier 30 and obtain high flat characteristics, curing is carried out after a light homogenity operation is carried out. Although the flat characteristics, the homogeneous coating amount, and control of regions are reduced as compared with the second embodiment of the manufacturing method, it is possible to easily spill resin from the surface of the chip 1. That is, as will be stated later, although it is considered that the periphery of the chip 1 is again sealed with liquid resin in accordance with a requested level of the reliablity, particularly, the humidity resistance characteristics, it is possible to simultaneously carry this out.

The manufacturing steps as shown in FIGS. 18D through 18G are the same as those as shown in FIGS. 11E through 11H.

Note that, the semiconductor device of the second embodiement is modified and is applied to the sixth embodiment; however, the first, third, fourth or fifth embodiment can be modified and applied to the sixth embodiment.

Also, although the sixth embodiment is similar to the prior art as shown in FIG. 4, in this prior art, resin is injected into the gap between the chip 1 and the insulating film 3 from the sides thereof, with difficulty, while, in the sixth embodiment, resin is easily injected into the gap between the chip 1 and the insulating film 3 from the center thereof.

Figure 11D:
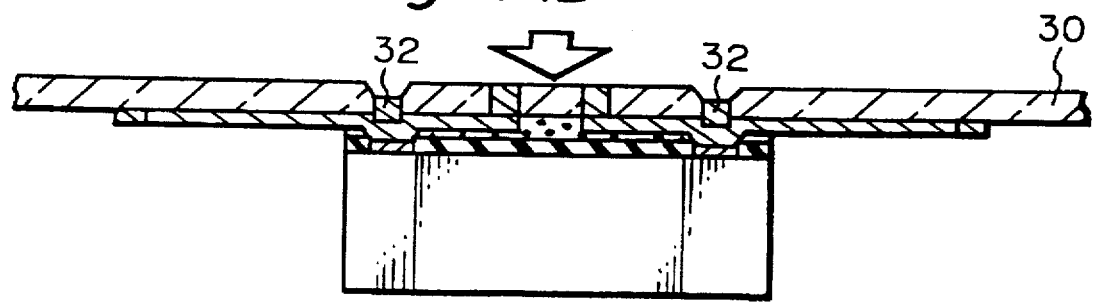
Figure 11E:
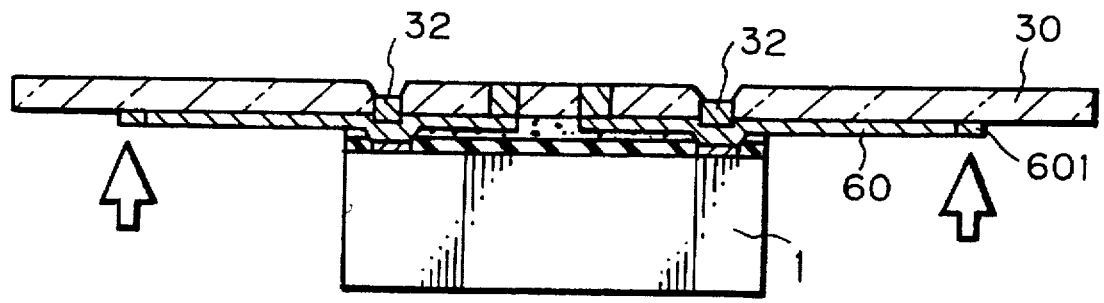
Figure 11F:
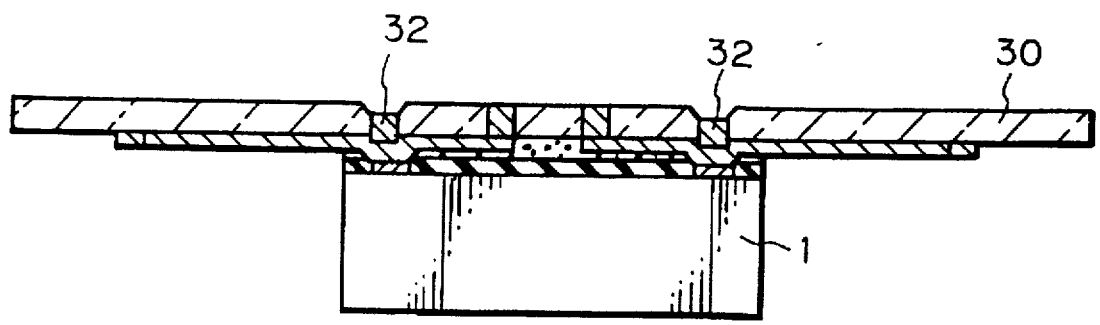
Figure 11G:
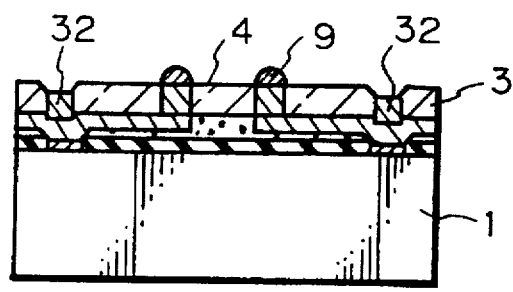
Figure 11H:
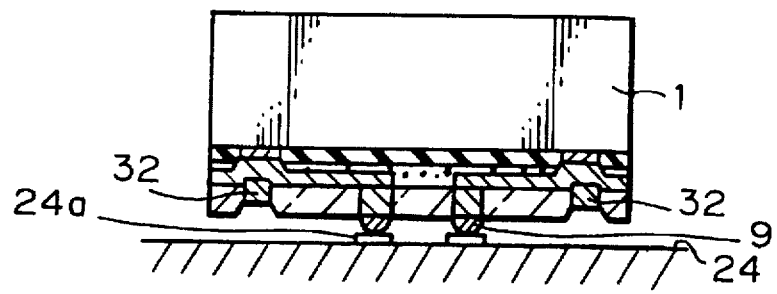
Figure 12:
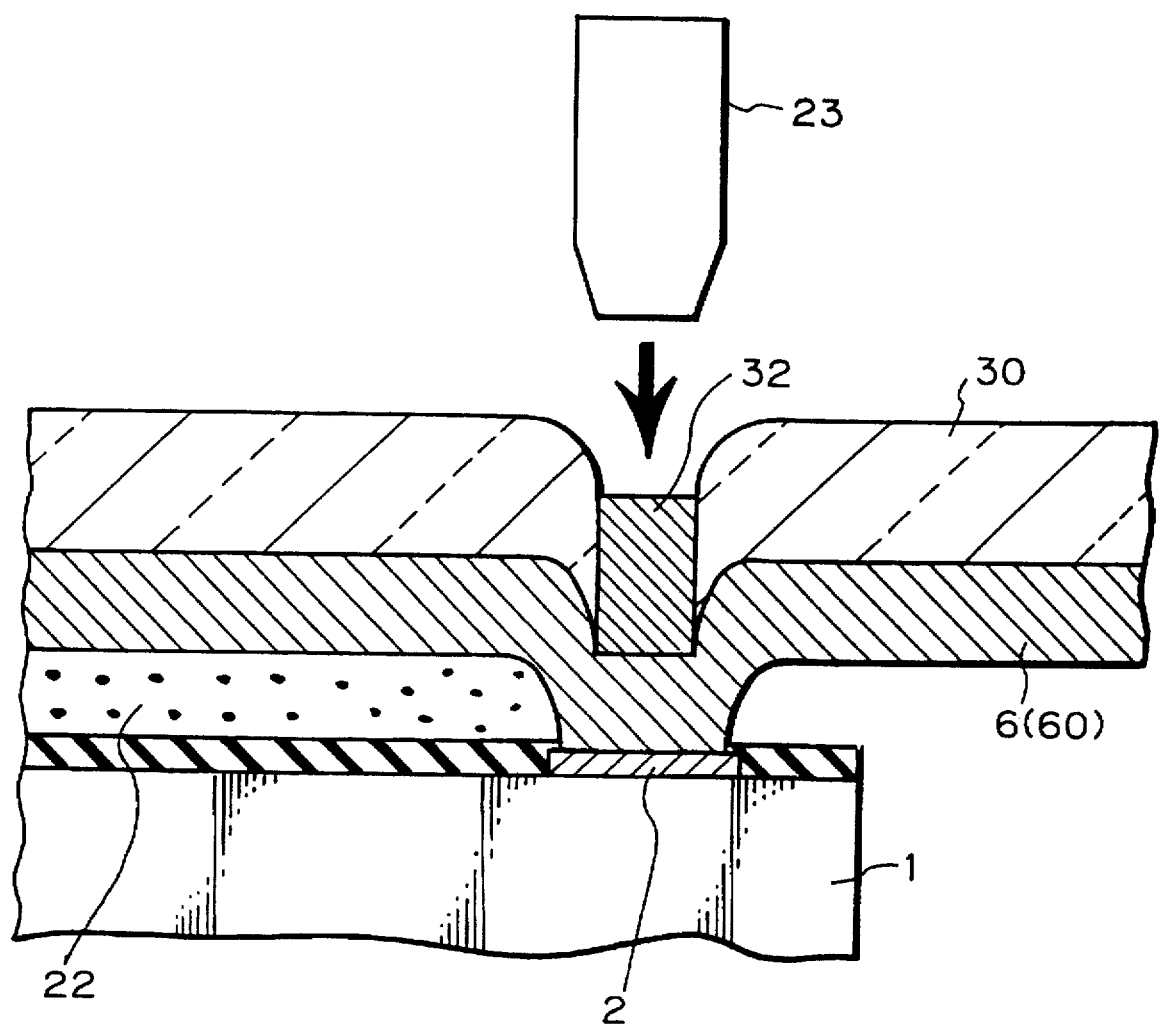
FIG. 12 is a partially-enlarged cross-sectional view of the device of FIG. 11C.
Figure 19:
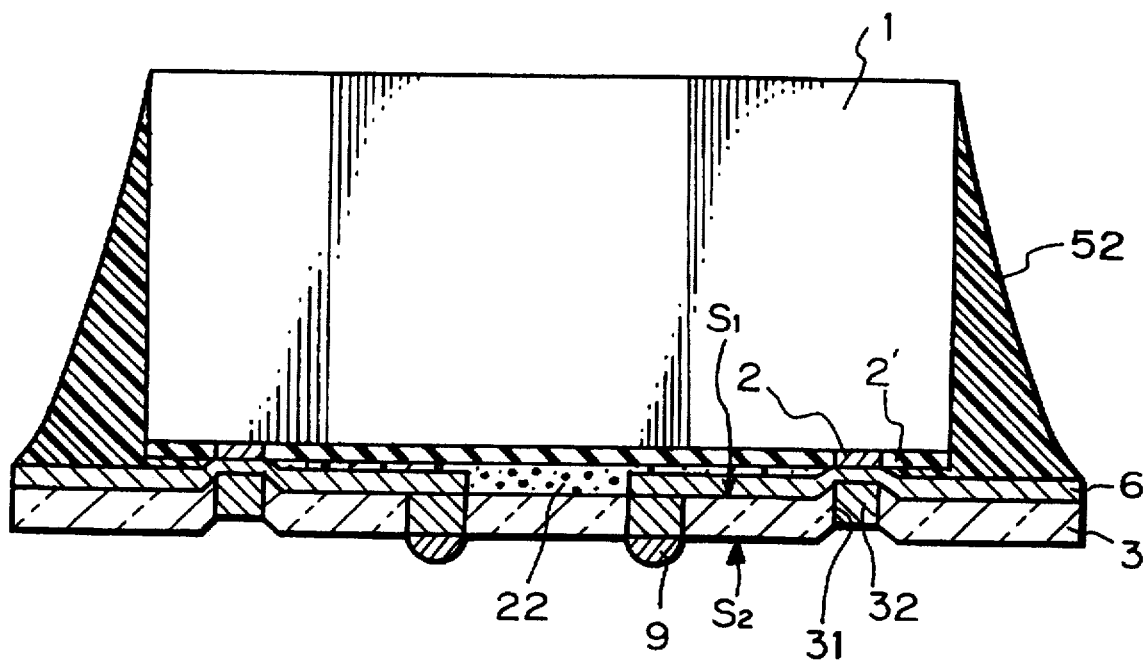
FIG. 19 is a cross-sectional view illustrating a seventh embodiment of the bump leaded film carrier type semiconductor device according to the present invention.

In FIG. 19A, which is a cross-sectional view illustrating a seventh embodiment of the bump leaded film carrier type semiconductor device according to the present invention, a step for sealing the periphery of the chip 1 with liquid resin 52 by potting is added, thus improving the humidity resistance. In this case, the back face of the chip 1 is not sealed in FIG. 19. Therefore, a heat spreader or a heat sink is adhered to the back face, to thereby improve heat dissipation characteristics. Such a sealing step is inserted between the steps as shown in FIGS. 11D and 11E. In this case, low stress, no void, contact characteristics and crack characteristics for solder are necessary. Also, a margin of about 0.5 mm at each side of the chip 1 and a margin of about 0.1 mm in a thickness direction of the chip 1 are required generally as sizes for easy manufacture. Note that, since sealing between the chip 1 and the film carrier 30 is already carried out, only the outside of the chip 1 is required to be immersed in resin.

Even in the seventh embodiment, the semiconductor device of the second embodiement is modified and is applied to the seventh embodiment; however, the first, third, fourth or fifth embodiment can be modified and applied to the seventh embodiment.

Figure 20A:
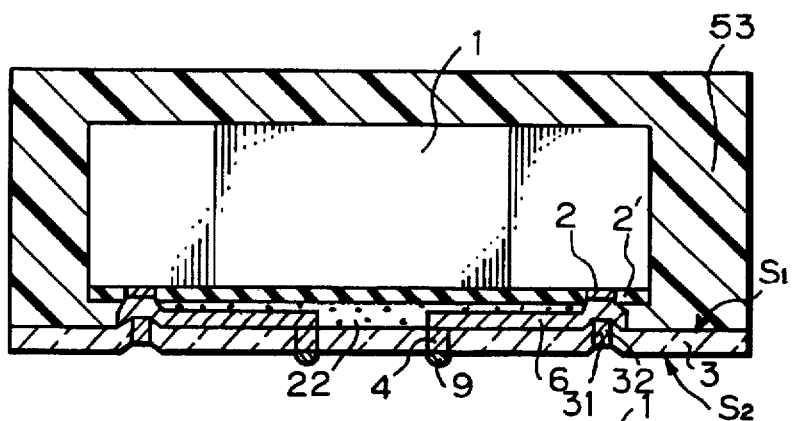
FIGS. 20A and 20B are cross-sectional views illustrating an eighth embodiment of the bump leaded film carrier type semiconductor device according to the present invention.
Figure 20B:
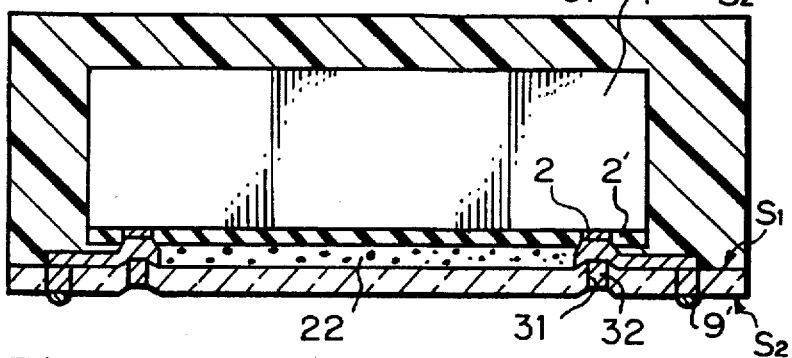
Figure 20C:
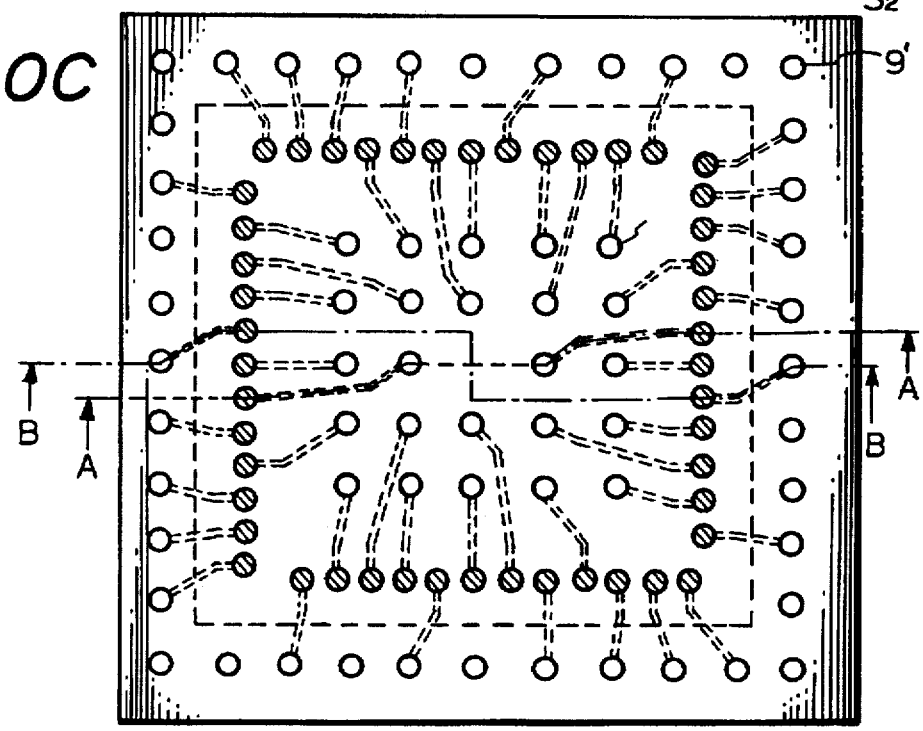
FIG. 20C is a bottom view of the device of FIGS. 20A and 20B.

FIG. 20A and 20B are cross-sectional views illustrating an eighth embodiment of the bump leaded film carrier type semiconductor device according to the present invention, and FIG. 20C is a bottom view of the device of FIG. 20A and 20B. Note that FIGS. 20A and 20B are cross-sectional views taken along the line A—A and the like B—B, respectively of FIG. 20C. In FIGS. 20A, 20B and 20C, the sides and back face of the chip 1 are covered by a resin layer 53. Particularly, conductive bumps 9' for outer leads are also provided on the insulating film 3 outside of the chip 1. Assume that the outer lead bumps 9, whose pitch is 0.5 mm, are arranged in a grid, then it is possible to arrange more bumps 9 than 226 in a chip mounting area of 7 mm square. In this case, the outer lead bumps 9' outside of the chip 1 are helpful in the enhancement of the integration while retaining the flat characteristics.

The manufacturing steps of the semiconductor device of FIGS. 20A, 20B and 20C are the same as those of FIGS. 11A through 11H except that a transfer molding step is added after the step as shown in FIG. 11E. In the transfer molding step, the device of FIGS. 11E is mounted on a lower metal mold, and then an upper metal mold is lowered to sandwich the device of FIG. 11E between the upper and lower metal molds. Then, heated resin is injected from a pot via a runner and a gate into a gap (cavity) within the metal molds. Provisional curing is carried out for several minutes. After that, the metal molds are taken out of the resin molded device. Then, final curing is carried out at a temperature of 170° to 180° C. for a couple of hours.

Note that, the semiconductor device of the second embodiement is modified and is applied to the eighth embodiment; however, the first, third, fourth or fifth embodiment can be modified and applied to the eighth embodiment.

As explained hereinbefore, according to the present invention, since use is made of an adhesive (tape) layer between a chip and an insulating film or resin injected from a center of the insulating film, the bump leaded semiconductor device of the present invention can be firm and small in size.

We claim:

1. A method for manufacturing a semiconductor device, comprising the steps of:

preparing an insulating film having a first surface on which conductive layers are formed and a second surface on which conductive protrusions connected through said insulating film to respective ones of said conductive layers are formed, said insulating film also having openings therethrough, said openings being covered with respective said conductive layers, preparing a semiconductor chip having pads located opposite respective said openings and a passivation film located so that said pads are surrounded by said passivation film, a surface of said pads being less distant from said semiconductor chip than a surface of said passivation film, adhering said semiconductor chip to said insulating film by an adhesive layer so that said openings oppose respective said pads through respective said conductive layers, and locally bending said conductive layers by inserting a bonding tool into said openings and pressing said conductive layers with said bonding tool, thereby electrically connecting said conductive layers with respective said pads.

2. A method as set forth in claim 1, wherein conductive members are inserted into through holes provided in said insulating film to electrically connect said conductive protrusions to respective ones of said conductive layers, and openings for locally pressing said conductive layers are provided in said insulating film.

3. A method as set forth in claim 2, wherein a filler is fitted into each of said openings.

4. A method as set forth in claim 1, wherein said conductive layers extend over through holes provided in said insulating film to reach respective ones of said conductive protrusions.

5. A method as set forth in claim 1, further comprising a step of potting only sides of said semiconductor device by resin after said locally pressing step is completed.

6. A method as set forth in claim 1, further comprising a step of transfer-molding said semiconductor device after said local pressing step is completed.

7. A method as set forth in claim 1, wherein said locally pressing step presses said conductive layers via fillers by using said bonding tool.

8. A method for manufacturing a semiconductor device, comprising the steps of:
  preparing an insulating film having a first surface on which conductive layers are formed, said insulating film also having openings therethrough, said openings being covered with respective said conductive layers;
  preparing a semiconductor chip having pads located opposite respective said openings and a passivation film located so that said pads are surrounded by said passivation film, a surface of said pads being less distant from said semiconductor chip than a surface of said passivation film;
  adhering said semiconductor chip to said insulating film by an adhesive layer to that said openings oppose respective said pads through respective said conductive layers; and
  locally bending said conductive layers by inserting a bonding tool into said openings and pressing said conductive layers with said bonding tool, thereby electrically connecting said conductive layers with respective said pads.

9. A method as set forth in claim 6, further comprising a step of forming conductive protrusions on a second surface of said insulating film, said conductive protrusions being connected through said insulating film to respective ones of said conductive layers.

10. A method as set forth in claim 9, wherein conductive members are inserted into through holes provided in said insulating film to electrically connect said conductive protrusions to respective ones of said conductive layers, and openings for locally pressing said conductive layers are provided in said insulating film.

11. A method as set forth in claim 10, wherein a filler is fitted into each of said openings.

12. A method as set forth in claim 9, wherein said conductive layers extend over through holes provided in said insulating film to reach respective ones of said conductive protrusions.

13. A method as set forth in claim 9, further comprising a step of potting only sides of said semiconductor device by resin after said local pressing step is completed.

14. A method as set forth in claim 9, further comprising a step of transfer-molding said semiconductor device after said local pressing step is completed.

15. A method as set forth in claim 8, wherein said locally pressing step presses said conductive layers via fillers by using said bonding tool.

16. A method for manufacturing a semiconductor device, comprising the steps of:
  preparing an insulating film having first surface and second surfacers and through holes therethrough, conductive layers being formed on said second surface, conductive protrusions being formed on said conductive layers, conductive members being formed in said through holes and being connected to respective ones of said conductive layers, said insulaing film also having openings therethrough, said openings being covered with respective said conductive layers;
  preparing a semiconductor chip having pads located opposite respective said openings and a passivation film located so that said pads are surrounded by said passivation film, a surface of said pads being less distant from said semiconductor chip than a surface of said passivation film;
  adhering said semiconductor chip to said insulating film by an adhesive layer so that said openings oppose respective said pads through respective said conductive layers, and
  locally bending said conductive members by inserting a bonding tool into said openings and pressing said conductive layers with said bonding tool, thereby electrically connecting conductive members with respective said pads.

17. A method as set forth in claim 16, wherein conductive protrusions are formed on said conductive members on a side of said first surface.

18. A method as set forth in claim 16, further comprising a step of potting only sides of said semiconductor device by resin after said local pressing step is completed.

19. A method as set forth in claim 16, further comprising a step of transfer-molding said semiconductor device after said local pressing step is completed.

20. A method as set forth in claim 16, wherein said locally pressing step presses said conductive members via fillers by using said bonding tool.

21. A method for manufacturing a semiconductor device, comprising the steps of:
  preparing an insulating film having first and second surfaces and through holes therethrough, conductive layers being formed on said second surface, conductive members being formed in said through holes and being connected to respective ones of said conductive layers, said insulating film also having openings therethrough, said openings being covered with respective said conductive layers;
  preparing a semiconductor chip having pads located opposite respective said openings and a passivation film located so that said pads are surrounded by said passivation film, a surface of said pads being less distant from said semiconductor chip than a surface of said passivation film;
  adhering said semiconductor chip to said insulating film by an adhesive layer so that said openings oppose respective said pads through respective said conductive layers; and
  locally bending said conductive members by inserting a bonding tool into said openings and pressing said conductive layers with said bonding tool, thereby electrically connecting said conductive members with respective said pads.

22. A method as set forth in claim 21, further comprising a step of forming first conductive protrusions on said conductive layers.

23. A method as set forth in claim 21, wherein second conductive protrusions are formed on said conducive members on a side of said first surface.

24. A method as set forth in claim 21, further comprising a step of potting only sides of said semiconductor device by resin after said local pressing step is completed.

25. A method as set forth in claim 21, further comprising a step of transfer-molding said semiconductor device after said local pressing step is completed.

26. A method as set forth in claim 21, wherein said locally pressing step presses said conductive members via fillers by using said bonding tool.

27. A method for manufacturing a semiconductor device, comprising the steps of:

preparing an insulating film having a first surface on which conductive layers are formed and a second surface on which conductive protrusions connected through said insulating film to respective ones of said conductive layers are formed, said insulating film having a resin injection opening at a center portion thereof, said insulating film also having openings therethrough, said openings being covered with respective said conductive layers;

preparing a semiconductor chip having pads located opposite respective said openings and a passivation film located so that said pads are surrounded by said passivation film, a surface of said pads being less distant from said semiconductor chip than a surface of said passivation film;

combining said semiconductor chip having pads with said insulating film so that said openings oppose respective said pads through respective said conductive layers;

locally bending said conductive layers by inserting a bonding tool into said openings and pressing said conductive layers with said bonding tool, thereby electrically connecting said conductive layers with respective said pads; and injecting resin via said resin injection opening into a gap between said insulating film and said semiconductor chip.

28. A method as set forth in claim 27, wherein conductive members are inserted into through holes provided in said insulating film to electrically connect said conductive protrusions to respective ones of said conductive layers, and openings for locally pressing said conductive layers are provided in said insulating film.

29. A method as set forth in claim 27, wherein a filler is fitted into each of said openings.

30. A method as set forth in claim 27, wherein said conductive layers extend over through holes provided in said insulating film to reach respective ones of said conductive protrusions.

31. A method as set forth in claim 27, further comprising a step of potting only sides of said semiconductor device by resin after said local pressing step is completed.

32. A method as set forth in claim 27, further comprising a step of transfer-molding said semiconductor device after said local pressing step is completed.

33. A method as set forth in claim 27, wherein said locally pressing step presses said conductive layers via fillers by using said bonding tool.

34. A method for manufacturing a semiconductor device, comprising the steps of:

preparing an insulating film having a first surface on which conductive layers are formed, said insulating film having a resin injection opening at a center portion thereof, said insulating film also having openings therethrough, said openings being covered with respective said conductive layers;

preparing a semiconductor chip having pads located opposite respective said openings and a passivation film located so that said pads are surrounded by said passivation film, a surface of said pads being less distant from said semiconductor chip than a surface of said passivation film;

combining said semiconductor chip with said insulating film so that said openings oppose respective said pads through respective said conductive layers;

locally bending said conductive layers by inserting a bonding tool into said openings and pressing said conductive layers with said bonding tool, thereby electrically connecting said conductive layers with respective said pads; and injecting resin via said resin injection opening into a gap between said insulating film and said semiconductor chip.

35. A method as set forth in claim 34, further comprising a step of forming conductive protrusions on a second surface of said insulating film, said conductive protrusions being connected through said insulating film to respective ones of said conductive layers.

36. A method as set forth in claim 34, wherein conductive members are inserted into through holes provided in said insulating film to electrically connect said conductive protrusions to respective ones of said conductive layers, and openings for locally pressing said conductive layers are provided in said insulating film.

37. A method as set forth in claim 34, wherein a filler is fitted into each of said openings.

38. A method as set forth in claim 34, wherein said conductive layers extend over through holes provided in said insulating film to reach respective ones of said conductive protrusions.

39. A method as set forth in claim 34, further comprising a step of potting only sides of said semiconductor device by resin after said local pressing step is completed.

40. A method as set forth in claim 34, further comprising a step of transfer-molding said semiconductor device after said local pressing step is completed.

41. A method as set forth in claim 34, wherein said locally pressing step presses said conductive layers via fillers by using said bonding tool.

42. A method for manufacturing a semiconductor device, comprising the steps of:

preparing an insulating film having first and second surfaces and through holes therethrough, conductive layers being formed on said second surface, conductive protrusions being formed on said conductive layers, conductive members being formed in said through holes and being connected to respective ones of said conductive layers, said insulating film having a resin injection opening at a center portion thereof, said insulating film also having openings therethrough, said openings being covered with respective said conductive layers;

preparing a semiconductor chip having pads located opposite respective said openings and a passivation film located so that said pads are surrounded by said passivation film, a surface of said pads being less distant from said semiconductor chip than a surface of said passivation film;

combining said semiconductor chip with said insulating film so that said openings oppose respective said pads through respective said conductive layers;

locally bending said conductive members by inserting a bonding tool into said openings and pressing said conductive members with said bonding tool, thereby electrically connecting said conductive members with respective said pads; and injecting resin via said resin injection opening into a gap between said insulating film and said semiconductor chip.

43. A method as set forth in claim 42, wherein conductive protrusions are formed on said conductive members on a side of said first surface.

44. A method as set forth in claim 42, further comprising a step of potting only sides of said semiconductor device by resin after said local pressing step is completed.

45. A method as set forth in claim 42, further comprising a step of transfer-molding said semiconductor device after said local pressing step is completed.

46. A method as set forth in claim 42, wherein said locally pressing step presses said conductive members via fillers by using said bonding tool.

47. A method for manufacturing a semiconductor device, comprising the steps of:

preparing an insulating film having first and second surfaces and through holes therethrough, conductive layers being formed on said second surface, conductive members being formed in said through holes and being connected to respective ones of said conductive layers, said insulating film having a resin injection opening at a center portion thereof, said insulating film also having openings therethrough, said openings being covered with respective said conductive layers;

preparing a semiconductor chip having pads located opposite respective said openings and a passivation film located so that said pads are surrounded by said passivation film, a surface of said pads being less distant from said semiconductor chip than a surface of said passivation film;

combining said semiconductor chip with said insulating film so that said openings oppose respective said pads through respective said conductive layers;

locally bending said conductive members by inserting a bonding tool into said openings and pressing said conductive members with said bonding tool, thereby electrically connecting said conductive members with respective said pads; and injecting resin via said resin injection opening into a gap between said insulating film and said semiconductor chip.

48. A method as set forth in claim 47, further comprising a step of forming first conductive protrutions on said conductive layers.

49. A method as set forth in claim 47, wherein second conductive protrusions are formed on said conductive members on a side of said first surface.

50. A method as set forth in claim 47, further comprising a step of potting only sides of said semiconductor device by resin after said local pressing step is completed.

51. A method as set forth in claim 47, further comprising a step of transfer-molding said semiconductor device after said local pressing step is completed.

52. A method as set forth in claim 47, wherein said locally pressing step presses said conductive members via fillers by using said bonding tool.

* * * * *